US007945405B2

(12) United States Patent
Ishida et al.

(10) Patent No.: US 7,945,405 B2
(45) Date of Patent: *May 17, 2011

(54) JITTER MEASUREMENT APPARATUS, JITTER MEASUREMENT METHOD, RECORDING MEDIA, COMMUNICATION SYSTEM AND TEST APPARATUS

(75) Inventors: Masahiro Ishida, Tokyo (JP); Kiyotaka Ichiyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 490 days.

This patent is subject to a terminal disclaimer.

(21) Appl. No.: 12/116,970

(22) Filed: May 8, 2008

(65) Prior Publication Data

US 2009/0281751 A1 Nov. 12, 2009

(51) Int. Cl.
*G01R 13/00* (2006.01)
*G06F 17/18* (2006.01)

(52) U.S. Cl. .......................................... 702/69; 702/179

(58) Field of Classification Search .................... 702/69, 702/66, 179; 375/226
See application file for complete search history.

(56) References Cited

U.S. PATENT DOCUMENTS 7,715,512 B2 * 5/2010 Ichiyama et al. ............. 375/371
2009/0281752 A1 * 11/2009 Ishida .............................. 702/71

OTHER PUBLICATIONS

Article Titled "A Test Case for 3 Gbps Serial Attached SCSI (SAS)" jointly authored by Cai et al., in Proc. IEEE International Test Conference, Austin, TX, Nov. 8-10, 2005.
Article Titled "Measuring Jitter of High Speed Data Channels Using Undersampling Techniques" jointly authored by Dalal et al., in Proc. IEEE International Test Conference, Washington, D.C., Oct. 18-23, 1998 (pp. 814-818).

* cited by examiner

*Primary Examiner* — Bryan Bui
(74) *Attorney, Agent, or Firm* — Jianq Chyun IP Office

(57) ABSTRACT

Provided is a jitter measurement apparatus, including a sampling section that samples a signal under measurement having a cycle T, a waveform reconfiguring section that shapes a reconfigured waveform having the cycle T by rearranging ordinal ranks of sample values sampled by the sampling section, a distribution generating section that generates a timing distribution of edges in the reconfigured waveform, and a statistical value calculating section that calculates a statistical value of the timing distribution. The sampling section may sample the signal under measurement having the cycle T a certain number of times N while the signal under measurement repeats for M cycles, where M and N are coprime.

21 Claims, 20 Drawing Sheets

JITTER MEASUREMENT APPARATUS, JITTER MEASUREMENT METHOD, RECORDING MEDIA, COMMUNICATION SYSTEM AND TEST APPARATUS

BACKGROUND

1. Technical Field

The present invention relates to a jitter measurement apparatus, a jitter measurement method, a recording medium, a communication system, and a test apparatus. In particular, the present invention relates to a jitter measurement apparatus, a jitter measurement method, a recording medium, a communication system, and a test apparatus for measuring timing jitter using a digital comparator such as a voltage comparator.

2. Related Art

Conventional methods for measuring timing jitter with a digital comparator include an undersampling method using a comparator and a failure counting method. These methods measure the RMS value of the jitter in the signal under measurement by calculating a jitter histogram.

The undersampling method using a comparator compares a voltage of a transition edge of the signal under test to a reference voltage at strobe timings supplied from a timing generator to generate logic H or logic L according to the transition edge timing. During this comparison, a trigger signal generated from the beginning of the test cycle is repeated to serve as the strobe signal, and samples the fluctuating edge timing while increasing the amount of time shift in the strobe.

The ratio of logic H at each strobe position is then calculated based on the data obtained from the sampling, thereby obtaining a cumulative density function (CDF) and a probability density function (PDF) of the transition edge timing. The undersampling method using a comparator measures the jitter in this way, as shown, for example, in W. Dalal, and D. Rosenthal, "Measuring Jitter of High Speed Data Channels Using Undersampling Techniques," in Proc. IEEE International Test Conference, pp. 814-818, Washington, D.C., Oct. 18-23, 1998.

The fail counting method measures the jitter by comparing the logic value of the signal under test to an expected value at a timing designated by a strobe. The CDF of the edge timing can be obtained by a fail counter, as shown in, for example, Y. Cai, L. Fang, R. Ratemo, J Liu, K. Gross, and M. Kozma, "A Test Case for 3 Gbps Serial Attached SCSI (SAS)," in Proc. IEEE International Test Conference, Austin, Tex., Nov. 8-10, 2005.

These timing jitter measurement methods, however, obtain the CDF by calculating the ratio of logic H at each strobe timing while gradually increasing the amount of time-shift of the strobe. Such methods take time to sample the amount of data used for the jitter analysis. A jitter measurement method and a jitter measurement apparatus are desired that can accurately calculate the jitter with a short sampling time.

SUMMARY

Therefore, it is an object of an aspect of the innovations herein to provide a jitter measurement apparatus, a jitter measurement method, a recording medium, a communication system, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary jitter measurement apparatus may include a jitter measurement apparatus including a sampling section that samples a signal under measurement having a cycle T, a waveform reconfiguring section that shapes a reconfigured waveform having the cycle T by rearranging ordinal ranks of sample values sampled by the sampling section, a distribution generating section that generates a timing distribution of edges in the reconfigured waveform, and a statistical value calculating section that calculates a statistical value of the timing distribution. The sampling section may sample the signal under measurement having the cycle T a certain number of times N while the signal under measurement repeats for M cycles, where M and N are coprime. The waveform reconfiguring section may rearrange initial ordinal ranks k of the sample values sampled by the sampling section to have reconfigured ordinal ranks i by inputting the initial ordinal ranks k into an expression i=k·M mod N, where k is expressed by integers from 0 to N−1, and uses these rearranged sample values to shape the reconfigured waveform having the cycle T.

The statistical value calculating section may calculate an expected value of the timing distribution as the statistical value. The statistical value calculating section may calculate a distribution width of the timing distribution as the statistical value. The jitter measurement apparatus may further include an ideal edge timing calculating section that calculates an ideal edge timing of the signal under measurement and an error sequence statistical value calculating section that calculates a statistical value of an error sequence obtained by arranging, in a time-series, differences between expected values of the timing distribution calculated by the statistical value calculating section and the ideal edge timing calculated by the ideal edge timing calculating section. The jitter measurement apparatus may further include an ideal edge timing calculating section that calculates an ideal edge timing of the signal under measurement and a Fourier transform section that calculates a frequency component of the error sequence obtained by arranging, in a time-series, that differences between the expected values of the timing distribution calculated by the statistical value calculating section and the ideal edge timing calculated by the ideal edge timing calculating section.

The distribution generating section may include a unit-interval waveform generating section that generates a plurality of unit-interval waveforms by dividing the reconfigured waveform into a plurality of unit intervals, an aggregate value calculating section that calculates an aggregate value at each phase in each of the plurality of unit-interval waveforms by adding together the sample values at the same phase of each unit-interval waveform, and a difference calculating section that calculates a difference between each pair of aggregate values at adjacent phases. The distribution generating section may generate the timing distribution based on the differences calculated by the difference calculating section.

The distribution generating section may further include a waveform inverting section that inverts the unit-interval waveforms generated by the unit-interval waveform generating section. The aggregate value calculating section may add the sample values of the unit-interval waveforms having rising edges to the sample values of the unit-interval waveforms having falling edges that are inverted by the waveform inverting section, or may add the sample values of the unit-interval waveforms having falling edges to the sample values of the unit-interval waveforms having rising edges that are inverted by the waveform inverting section. The jitter measurement apparatus may further include a prescribed bit unit-interval waveform group selecting section that selects the unit-interval waveforms generated by the unit-interval waveform generating section at prescribed bit intervals in the signal under measurement, and the aggregate value calculating section may add the sample values of the unit-interval waveforms having rising edges to the sample values of the unit-interval waveforms having falling edges that are inverted by the waveform inverting section in the group of unit-interval waveforms selected by the prescribed bit unit-interval waveform group selecting section. The aggregate value calculating section may add together the sample values of the unit-interval waveforms having rising edges or the sample values of the unit-interval waveforms having falling edges.

The jitter measurement apparatus may further include an identical data sequence unit-interval waveform group selecting section that selects, from among the unit-interval waveforms generated by the unit-interval waveform generating section, a group of unit-interval waveforms having identical data sequences in the signal under measurement immediately prior thereto, and the aggregate value calculating section may add together the sample values of each unit-interval waveform in the group selected by the identical data sequence unit-interval waveform group selecting section. The jitter measurement apparatus may further include a prescribed bit unit-interval waveform group selecting section that selects the unit-interval waveforms generated by the unit-interval waveform generating section at prescribed bit intervals in the signal under measurement, and the aggregate value calculating section may add together the sample values of each unit-interval waveform in the group selected by the prescribed bit unit-interval waveform group selecting section.

The configurations described above can be adopted in a similar manner to provide a jitter measurement method, a recording medium storing thereon a program used by the jitter measurement apparatus, a communication system including a transmitter and a receiver, and a test apparatus that supplies a test signal to a device under test to test the device under test. The communication system and the test apparatus may further include a jitter value notification section that that provides notification concerning the statistical value calculated by the statistical value calculating section, which is a jitter value of the signal under measurement, and a frequency characteristic adjusting section that adjusts a frequency characteristic of the signal under measurement to decrease jitter value according to the jitter value as notified by the jitter value notification section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
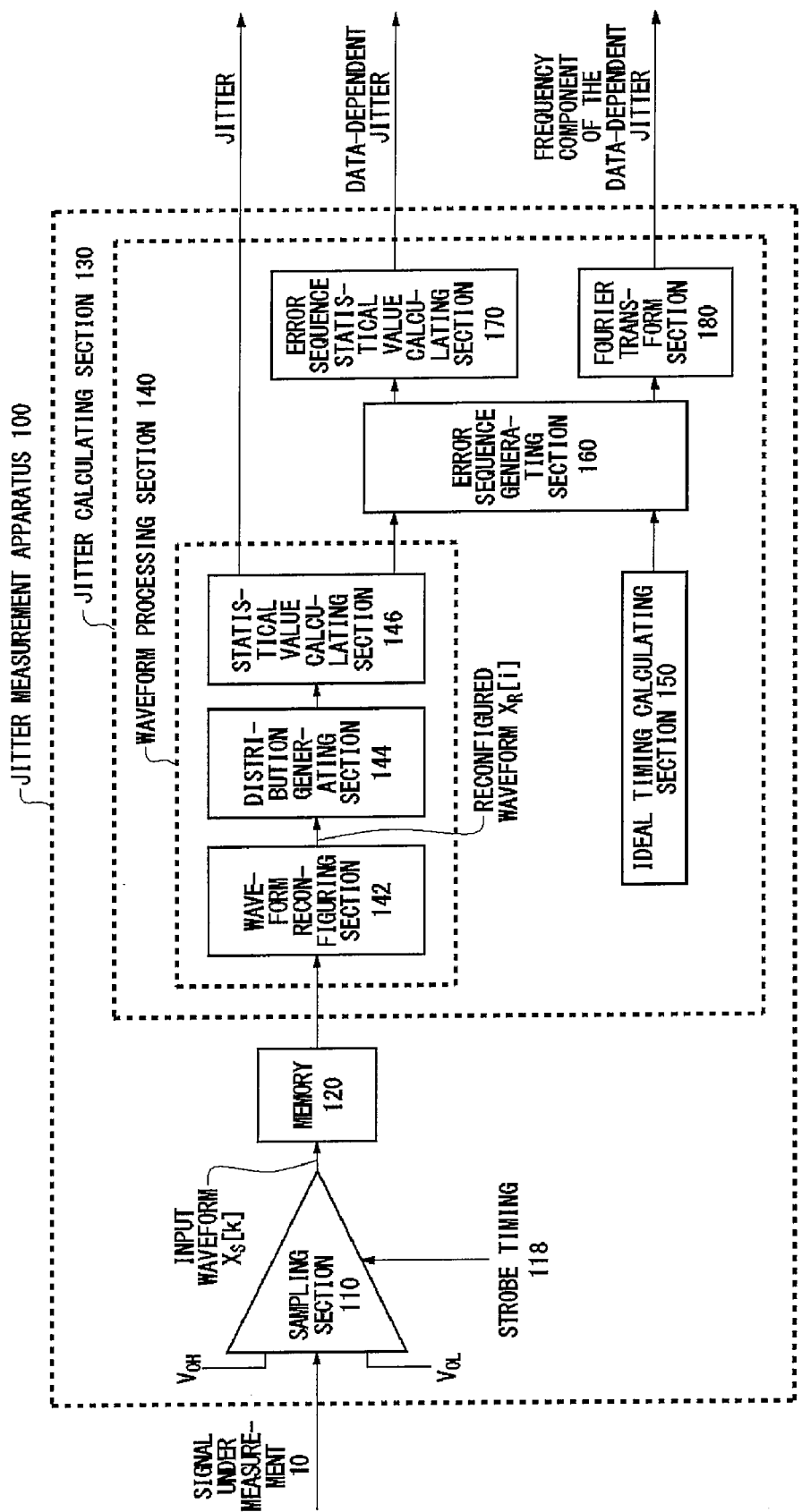
FIG. 1 is shows an exemplary configuration of a jitter measurement apparatus 100.

FIG. 1 is a block diagram showing an exemplary configuration of a jitter measurement apparatus 100. The jitter measurement apparatus 100 receives a signal under measurement 10 as input and outputs a jitter value of the signal under measurement 10. The jitter measurement apparatus 100 may output a deterministic jitter value, such as a data-dependent jitter value, as well as a frequency component of the deterministic jitter. The jitter measurement apparatus 100 is provided with a sampling section 110 and a jitter calculating section 130, and may also be provided with a memory 120.

The sampling section 110 samples the signal under measurement 10 having a cycle T. For example, the sampling section 110 samples the signal under measurement 10 having the cycle T a certain number of times N while the signal under measurement 10 is repeating for M cycles, where N and M are coprime. The sampling section 110 may sample the input signal under measurement 10 with a sampling cycle Ts, based on a strobe timing 118, to form an input waveform $X_S[k]$. Here, k represents the ordinal rank of the sample values sampled by the sampling section 110, and may be an integer from 0 to N−1. The integer k represents the initial sampling ordinal rank and the value of k in the input waveform $X_S[k]$ increases in the sampled order.

The sampling section 110 is an AD converter or a voltage comparator (sometimes referred to hereinafter as an "ADC"), for example. The sampling section 110 may be a digital comparator or a waveform digitizer. The resolution of the ADC is 1 bit or 1.6 bits, for example. When the ADC with a 1-bit resolution is used, the sample values of the input waveform $X_S[k]$ may be expressed by binary logic values, such as 0 and 1. When the ADC with a 1.6-bit resolution is used, the sample values of the input waveform $X_S[k]$ may be expressed by three values. The sampling section 110 is not limited to sampling the signal under measurement 10 only while the signal under measurement 10 having the cycle T is repeating for M cycles. For example, the sampling section 110 may sample the signal under measurement 10 while the signal under measurement 10 is repeating for 5M cycles.

The memory 120 may store sampling results and the like of the sampling section 110. For example, the memory 120 stores sample values of the input waveform $X_S[k]$, obtained by the sampling section 110 sampling the signal under measurement 10, in association with k indicating the initial ordinal rank with an integer from 0 to N−1.

The jitter calculating section 130 calculates an edge timing distribution of the signal under measurement 10 and outputs the jitter value of the signal under measurement 10. The jitter calculating section 130 may obtain the jitter value of the signal under measurement 10 by reading the input waveform $X_S[k]$ stored in the memory 120. The jitter calculating section 130 has a waveform processing section 140, and may also have an ideal edge timing calculating section 150, an error sequence generating section 160, an error sequence statistical value calculating section 170, and a Fourier transform section 180.

Upon receiving the input waveform $X_S[k]$ acquired from the memory 120, the waveform processing section 140 outputs the statistical value of the edge timing distribution of the signal under measurement 10, for example. The waveform processing section 140 has a waveform reconfiguring section 142, a distribution generating section 144, and a statistical value calculating section 146.

The waveform reconfiguring section 142 rearranges the order of the sample values of the input waveform $X_S[k]$ sampled by the sampling section 110 to shape a reconfigured waveform $X_R[i]$ having a cycle T. Here, i represents the rearranged ordinal rank. The relationship between the rearranged ordinal rank i and the initial ordinal rank k is shown by Expression 1, and i may be an integer from 0 to N−1. When M is expressed by M=nN+1, where n is any natural number, the rearranging process described above can be omitted since i=k.

$$i=(k \cdot M) \bmod N \qquad \text{Expression 1}$$

When the signal under measurement 10 has the cycle T and M and N are coprime, the sampling section 110 can sample the signal under measurement 10 with a cycle Te that is shorter than a sampling cycle Ts. This effective sampling cycle Te is shown by Expression 2. Hereinafter, the effective sampling cycle Te is sometimes referred to as an "equivalent sampling time interval".

$$Te = T/N = Ts/M \qquad \text{Expression 2}$$

The distribution generating section 144 generates a timing distribution of the edges in the reconfigured waveform $X_R[i]$. This distribution is sometimes referred to hereinafter as an "edge timing distribution", and the edge timing distribution is an example of the timing distribution. The edge timing distribution may be a PDF of the timing of each edge in the signal under measurement 10.

The statistical value calculating section 146 calculates the statistical value of the edge timing distribution. The statistical value calculating section 146 may calculate an expected value of the edge timing distribution and a distribution width of the edge timing distribution as the statistical value. Here, the expected value may be an average value. The distribution width may be an indicator of the range of the data variation, such as a variance, a standard deviation, a quartile deviation, an RMS value, a peak-to-peak value, and a half width. The jitter measurement apparatus 100 may output the distribution width of the edge timing distribution as the jitter value of the signal under measurement 10.

The ideal edge timing calculating section 150 may calculate the ideal edge timing of the signal under measurement 10. The ideal edge timing calculating section 150 may calculate the ideal edge timing of each edge in the signal under measurement 10. In the present embodiment, the ideal edge timing refers to the edge timing when the signal under measurement 10 does not contain jitter.

The error sequence generating section 160 may generate an error sequence obtained by arranging the errors between the expected values of the edge timing distribution calculated by the statistical value calculating section 146 and the ideal edge timing calculated by the ideal edge timing calculating section 150, in a time-series. The error sequence generating section 160 calculates the error of a specific edge in the signal under measurement 10 to be the difference between the expected value of the edge timing obtained from the edge timing distribution and the ideal edge timing corresponding to the aforementioned edge. The error sequence generating section 160 may calculate the error for a plurality of edges to generate the error sequence in which each edge is associated with the error of the same edge. By doing this, the error sequence generating section 160 can average the random component of the timing jitter, and can therefore measure the deterministic jitter, such as the data-dependent jitter, for example.

The error sequence statistical value calculating section 170 may calculate the statistical value of the error sequence. The statistical value of the error sequence may be the same as the statistical value calculated by the statistical value calculating section 146, or may be an RMS value or a peak-to-peak value.

The Fourier transform section 180 calculates the frequency component of the error sequence by performing a Fourier transform of the error sequence. If the errors included in the error sequence are not spaced uniformly on the time axis, the Fourier transform section 180 may interpolate the jitter value at a bit boundary having no jitter value from the previous and subsequent jitter values to generate the error sequence in which the errors are spaced uniformly on the time axis, and then perform the Fourier transform of the thus generated error sequence.

The jitter measurement apparatus 100 may be hardware or may be software that causes a processor, not shown, to execute a process. The processor may be a CPU or a computer controlling the process. The functions of the elements included in the jitter calculating section 130 are not strictly separated. For example, the statistical value calculating section 146 may have the functions of the distribution generating section 144 and the error sequence generating section 160 may have the functions of the waveform processing section 140.

Figure 2:
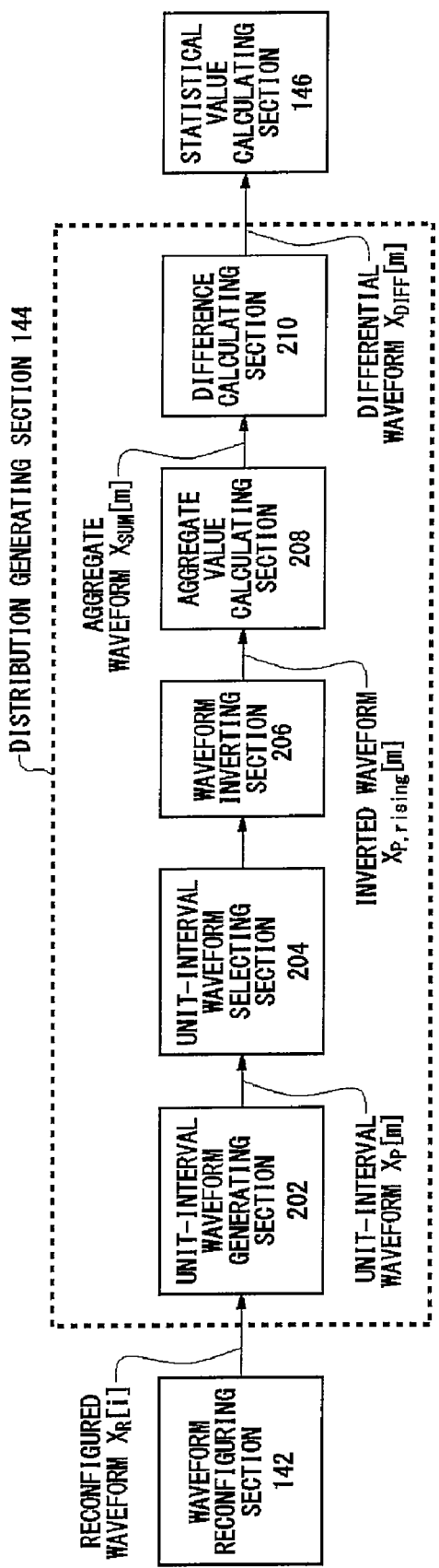
FIG. 2 shows an exemplary configuration of the waveform processing section 140.

FIG. 2 is a block diagram showing an exemplary configuration of the waveform processing section 140. The waveform processing section 140 includes the waveform reconfiguring section 142, the distribution generating section 144, and the statistical value calculating section 146, as described above. The distribution generating section 144 includes a unit-interval waveform generating section 202, an aggregate value calculating section 208, and a difference calculating section 210, and may also include a unit-interval waveform group selecting section 204 and a waveform inverting section 206.

Upon receiving the reconfigured waveform $X_R[i]$ from the waveform reconfiguring section 142, the unit-interval waveform generating section 202 divides $X_R[i]$ into a prescribed number of unit intervals Tu to generate a plurality of unit-interval waveforms $X_p[m]$. The unit-interval waveform generating section 202 desirably divides the reconfigured waveform $X_R[i]$ such that each unit-interval waveform $X_p[m]$ has an edge roughly in the center.

Here, the coefficient Lu and the bit period Tb, which represents the bit time interval of the signal under measurement 10, are used to express Tu as Tu=Lu·Tb. If Lu=1, for example, Tu may be equal to the bit period Tb representing the bit time interval of the signal under measurement 10, and Tu is desirably chosen to be a value such that Tu/Te is equal to a positive integer. It is desirable that Lu be a positive integer. The ordinal rank of a certain unit-interval waveform $X_p[m]$ in the plurality of unit-interval waveforms $X_p[m]$ is represented by p. For example, the number Nu of unit-interval waveforms $X_p[m]$ included in the sampled signal under measurement 10 is used to express p as an integer from 1 to Nu. The number Nu may be greater than N, depending on the sampling period of the signal under measurement 10.

The ordinal rank of the sample values of the unit-interval waveforms $X_p[m]$ is represented by m. Hereinafter, m is sometimes referred to as the "ordinal rank after division". The relation between the ordinal rank after division m and the reconfigured ordinal rank i is shown by Expression 3. In Expression 3, Tu/Te represents the number of sample values included in each unit-interval waveform $X_p[m]$. The ordinal rank after division m is represented by an integer from 0 to (Tu/Te)−1.

$$m=i \bmod(Tu/Te)=i \bmod(N \cdot Tu/T) \quad \text{Expression 3}$$

The unit-interval waveform group selecting section 204 may generate a unit-interval waveform group by selecting unit-interval waveforms $X_p[m]$ having a prescribed feature from among the plurality of unit-interval waveforms $X_p[m]$ generated by the unit-interval waveform generating section 202 dividing the reconfigured waveform $X_R[i]$. For example, the unit-interval waveform group selecting section 204 selects only the unit-interval waveforms $X_p[m]$ having a rising edge or only the unit-interval waveforms $X_p[m]$ having a falling edge. If the ADC with a 1-bit resolution is used, the unit-interval waveform group selecting section 204 may select the unit-interval waveforms $X_p[m]$ having a rising edge by selecting only the unit-interval waveforms $X_p[m]$ in which the first sample value is logic L. In the same manner, the unit-interval waveform group selecting section 204 may select the unit-interval waveforms $X_p[m]$ having a falling edge by selecting only the unit-interval waveforms $X_p[m]$ in which the first sample value is logic H.

The waveform inverting section 206 may invert the unit-interval waveforms $X_p[m]$ generated by the unit-interval waveform generating section 202. By doing this, the waveform inverting section 206 can invert the unit-interval waveforms $X_p[m]$ having falling edges to be unit-interval waveforms $X_p[m]$ having rising edges. It should be noted that the edge timing of the edges in the unit-interval waveforms $X_p[m]$ does not change even when the unit-interval waveform group selecting section 204 inverts the unit-interval waveforms $X_p[m]$.

The aggregate value calculating section 208 adds the sample values of identical phases in the plurality of unit-interval waveforms $X_p[m]$ to obtain an aggregate value for each phase. For example, the aggregate value calculating section 208 may calculate the aggregate value at each ordinal rank after division m by adding together the sample values at each of the ordinal ranks after division m, which has a relation to the reconfigured ordinal ranks i as expressed by m=i mod (N·Tu/T), included in the unit-interval waveform $X_p[m]$. The aggregate value calculating section 208 may add the sample values of the unit-interval waveforms $X_p[m]$ having rising edges and the inverted sample values of the unit-interval waveforms $X_p[m]$ having falling edges that are inverted by the waveform inverting section 206. The aggregate value calculating section 208 may instead add the sample values of the unit-interval waveforms $X_p[m]$ having falling edges and the inverted sample values of the unit-interval waveforms $X_p[m]$ having rising edges that are inverted by the waveform inverting section 206.

The aggregate value calculating section 208 may instead add only the sample values of the unit-interval waveforms $X_p[m]$ having rising edges, or may add only the sample values of the unit-interval waveforms $X_p[m]$ having falling edges. For example, the jitter of the rising edges and of the falling edges is different if the signal under measurement 10 is a clock signal with a duty ratio other than 50%. Even if the signal under measurement 10 is such a signal, the jitter measurement apparatus 100 described above can accurately measure both the jitter in the falling edges and the jitter in the rising edges respectively.

The difference calculating section 210 calculates the difference between two aggregate values in adjacent phases. For example, the difference calculating section 210 calculates the difference between aggregate values having adjacent ordinal ranks after division m for the aggregate value at each ordinal rank after division m in the plurality of unit-interval waveforms $X_p[m]$. The distribution generating section 144 generates the timing distribution based on the differences calculated by the difference calculating section 210. For example, the distribution generating section 144 may generate the edge timing distribution in which the differences calculated by the difference calculating section 210 are associated with the ordinal rank after division m.

Figure 3:
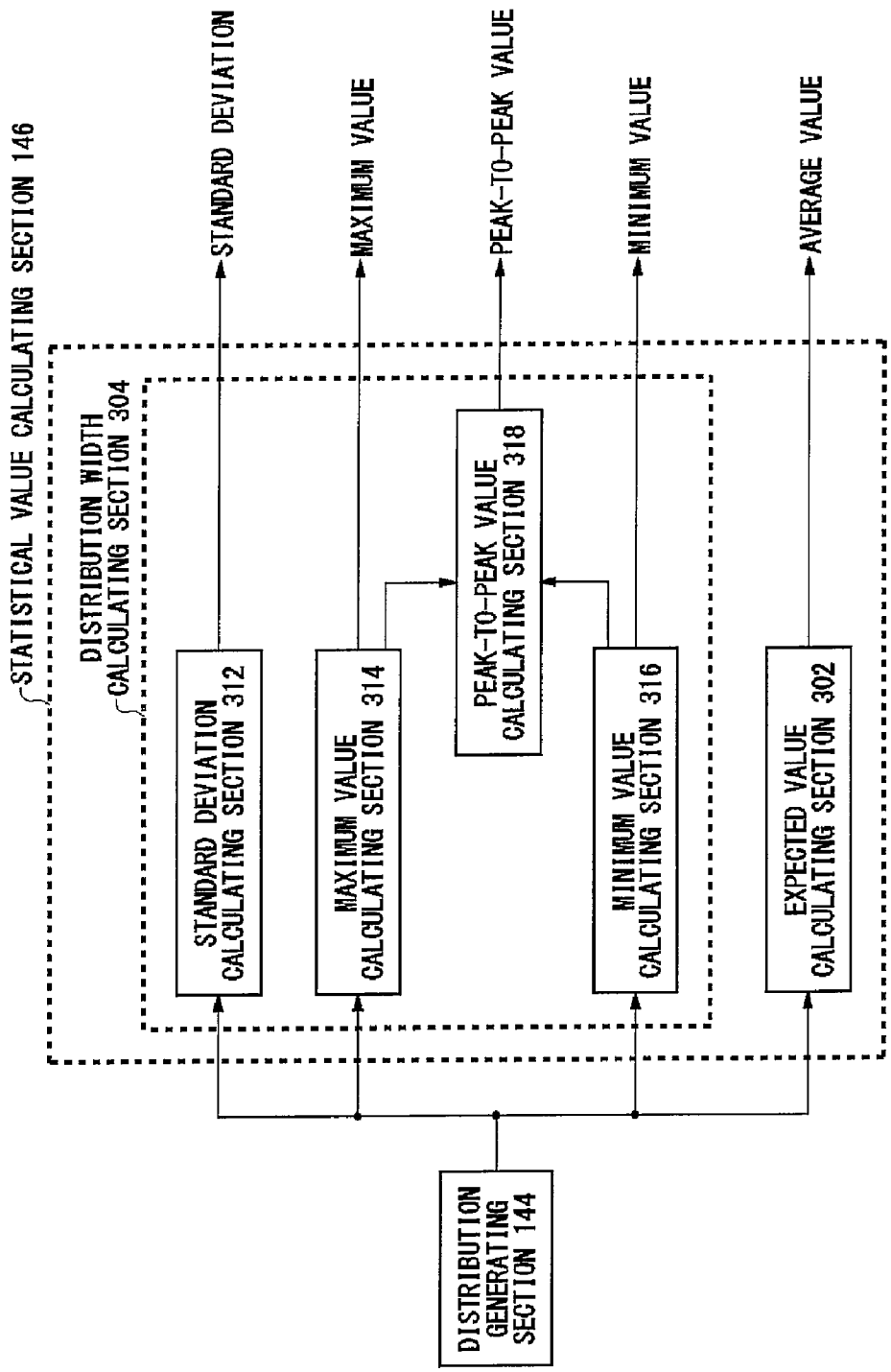
FIG. 3 shows an exemplary configuration of the statistical value calculating section 146.

FIG. 3 is a block diagram showing an exemplary configuration of the statistical value calculating section 146. The statistical value calculating section 146 calculates the statistical value of the edge timing distribution generated by the distribution generating section 144. The statistical value calculating section 146 may have an expected value calculating section 302 and a distribution width calculating section 304. The expected value calculating section 302 may calculate the expected value of the edge timing distribution. The expected value of the edge timing distribution is an average value, for example. The difference between the expected value and the ideal edge timing may be calculated as the jitter.

The distribution width calculating section 304 may calculate the distribution width of the edge timing distribution. By doing this, the distribution width calculating section 304 can calculate the width of the fluctuation of the edge timing distribution on the time axis. The distribution width calculating section 304 may calculate this distribution width as the jitter. The distribution width calculating section 304 may have a standard deviation calculating section 312, a maximum value calculating section 314, a minimum value calculating section 316, and a peak-to-peak calculating section 318. The standard deviation calculating section 312 calculates the standard deviation of the edge timing distribution, as an example of the distribution width. The maximum value calculating section 314 calculates the maximum value of the edge timing distribution, as an example of the distribution width. The minimum value calculating section 316 calculates the minimum value of the edge timing distribution, as an example of the distribution width. The peak-to-peak calculating section 318 may calculate the peak-to-peak value, which is an example of the distribution width. The peak-to-peak calculating section 318 may calculate the peak-to-peak value by subtracting the minimum value calculated by the minimum value calculating section 316 from the maximum value calculated by the maximum value calculating section 314.

By adopting the configuration described above, the waveform processing section 140 can generate the edge timing of the signal under measurement 10 based on the sampled input waveform $X_S[k]$. The waveform processing section 140 can also calculate the statistical value of the edge timing distribution by calculating the statistical value of the generated edge timing distribution. The following is a detailed description of the performances of the waveform reconfiguring section 142, the distribution generating section 144, and the statistical value calculating section 146 in the waveform processing section 140.

Figure 4:
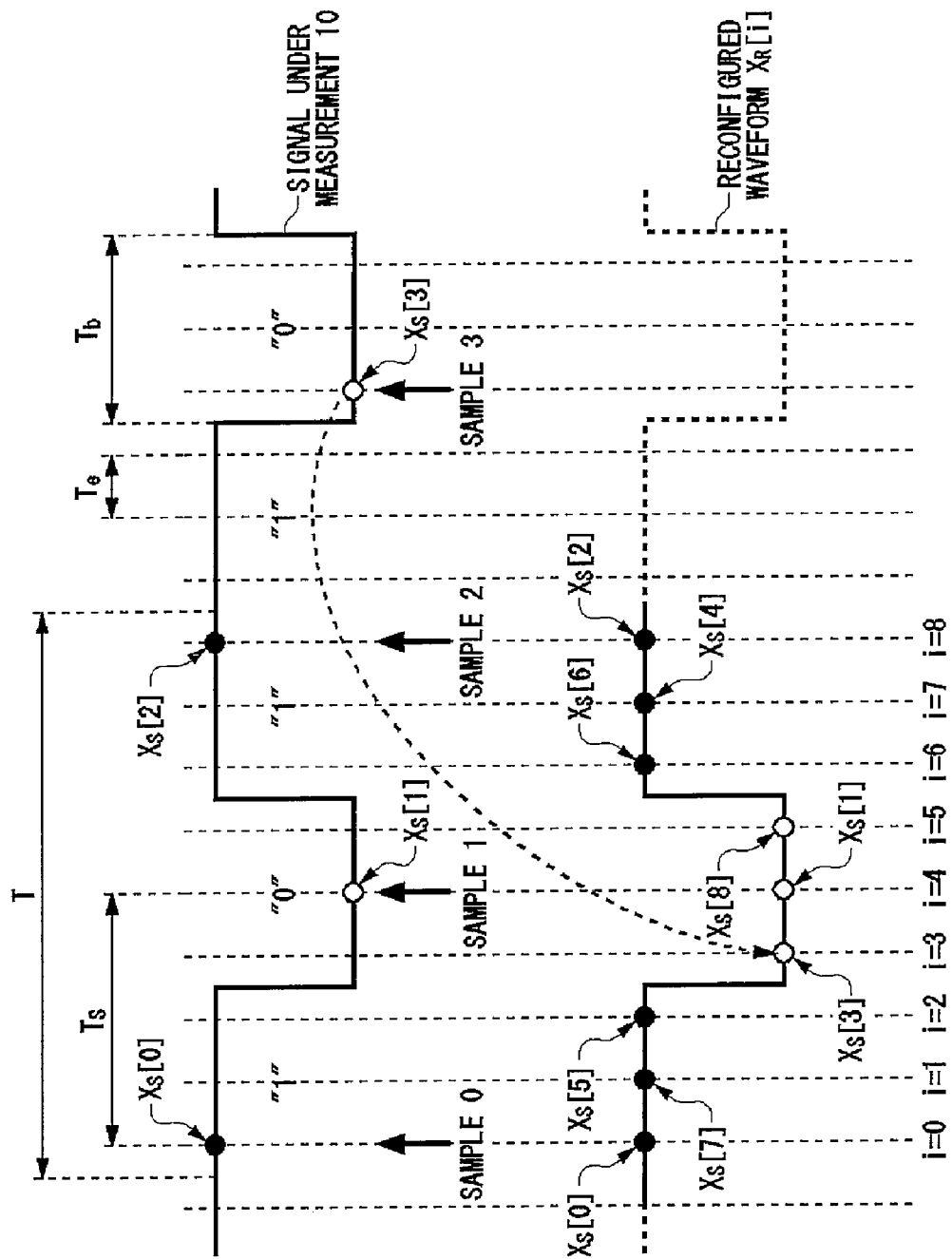
FIG. 4 shows a method by which the waveform reconfiguring section shapes the reconfigured waveform.

FIG. 4 shows a method by which the waveform reconfiguring section 142 shapes the reconfigured waveform. FIG. 4 describes the basics of the process performed by the waveform reconfiguring section 142 when the signal under measurement 10 is a 3-bit data signal having a data sequence "101". In FIG. 4, the thick line near the top represents the signal under measurement 10, the thick line at the bottom represents the reconfigured waveform $X_R[i]$, the white circles represent logic L, and the black circles represent logic H. The signal under measurement 10 that is used is a data signal in which the bit period is Tb and the repeating cycle L of the data pattern is 3 bits. The sampling section 110 samples the signal under measurement 10 in synchronization with the repeating period of the signal under measurement 10 with a sampling frequency Ts that is less than the Nyquist frequency. The equivalent sampling time intervals Te are set equal to Tb/3, and the sampling cycle Ts is set equal to 4Te. Here, N=9, M=4, and M and N are coprime.

In FIG. 4, sample 0 represents the point at which the sampling begins, that is, the sampling occurring at the timing k=0. As shown in FIG. 4, the sample value of the input waveform $X_S[0]$ at sample 0 was logic H. Sample 1 represents the point reached after the time Ts has passed since sample 0, that is, the sampling occurring at the timing k=1. The sample value of the input waveform $X_S[1]$ at sample 1 was logic L. The input waveform $X_S[k]$ was obtained by sampling the signal under measurement 10 at the timings k=0 to k=8 in the same manner described above.

The sample values of the input waveform $X_S[k]$ obtained by the sampling section 110 through the sampling described above are arranged according to the initial ordinal rank k as sampled by the sampling section 110. The waveform reconfiguring section 142 obtains the reconfigured waveform $X_R[i]$ having the cycle T by rearranging the order of the sample values to have the rearranged ordinal rank i. The reconfigured ordinal rank i is obtained from Expression 1. For example, the i corresponding to k=3 is i=(3·4) mod 9=3. Specifically, the sample value sampled at a time when 3Ts has passed since initiation of the sampling is treated in the reconfigured waveform $X_R[i]$ as a sample value sampled at a time when 3Te has passed since initiation of the sampling. The waveform reconfiguring section 142 obtains the reconfigured waveform $X_R[i]$ by rearranging the sample values from k=0 to k=8 in the same manner.

Figure 5:
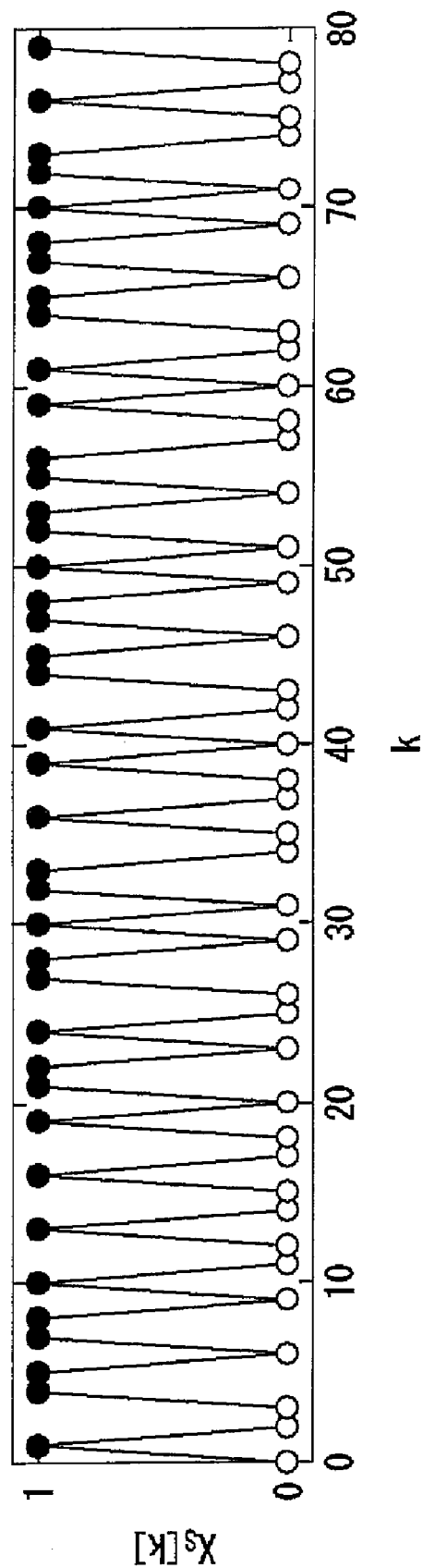
FIG. 5 shows exemplary sample values of the input waveform $X_S[k]$.

FIG. 5 shows exemplary sample values of the input waveform $X_S[k]$. FIG. 5 shows an example of the results of a different sampling in which an ADC with a 1-bit resolution samples the signal under measurement 10. In FIG. 5, the signal under measurement 10 is a clock pattern. The sampling frequency Ts is set to be less than the Nyquist frequency and M and N are set to be coprime. As shown in FIG. 5, 80 samples are performed from k=0 to k=79. The following describes the processes performed by the distribution generating section 144 and the statistical value calculating section 146 using the input waveform $X_S[k]$ of FIG. 5 as an example.

Figure 6:
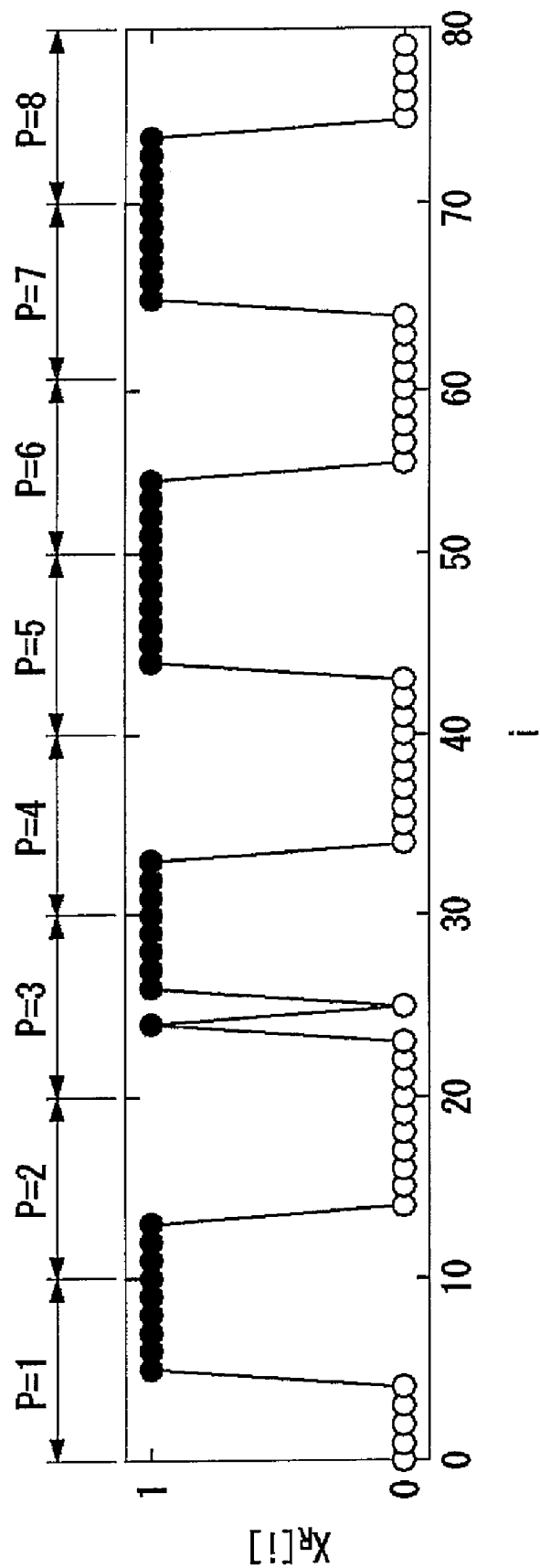
FIG. 6 shows an example of the waveform obtained by reconfiguring the signal under measurement 10.

FIG. 6 shows an example of the reconfigured waveform $X_R[i]$ obtained by reconfiguring the input waveform $X_S[k]$ of FIG. 5. The reconfigured waveform $X_R[i]$ has 80 sample values from i=0 to i=79, and the interval between sample values is expressed by the equivalent sampling time interval Te. In the reconfigured waveform $X_R[i]$, the bit period Tb is set equal to the unit interval Tu, so that the unit-interval waveform $X_p[m]$ repeats eight times.

Figure 7:
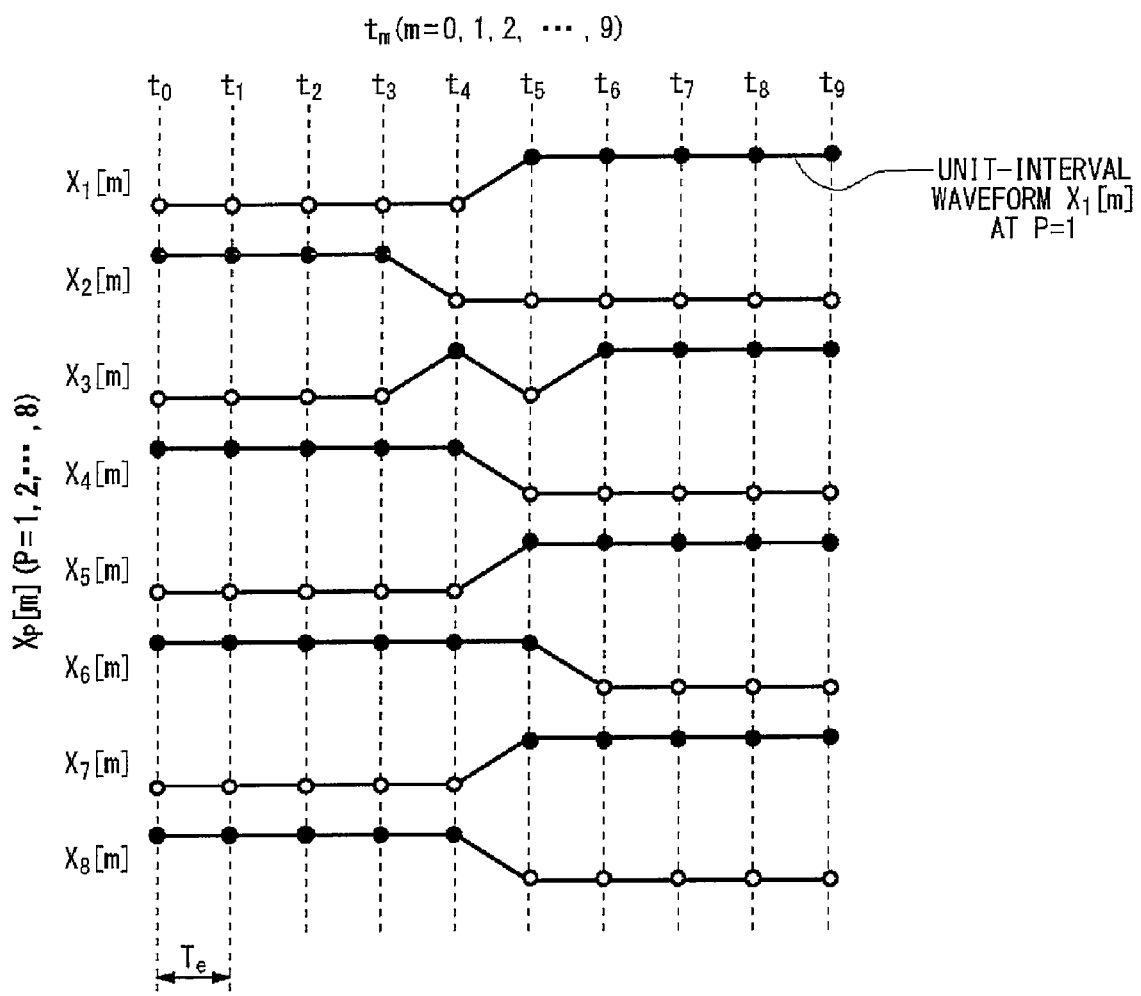
FIG. 7 shows an example of a unit-interval waveform in the signal under measurement 10.

FIG. 7 shows an example of the unit-interval waveform $X_p[m]$ included in the reconfigured waveform $X_R[i]$ of FIG. 6. FIG. 7 is used to describe the general process performed by the unit-interval waveform generating section 202. When the bit period Tb is set equal to the unit interval Tu and the reconfigured waveform $X_R[i]$ is divided into a plurality of unit intervals Tu, eight unit-interval waveforms $X_p[m]$ are obtained from p=1 to p=8. As shown in FIG. 7, each unit-interval waveform $X_p[m]$ includes ten sample values from m=0 to m=9. The unit-interval waveforms $X_p[m]$ at p=1, 3, 5, 7 have rising edges, and the unit-interval waveforms $X_p[m]$ at p=2, 4, 6, 8 have falling edges.

Figure 8:
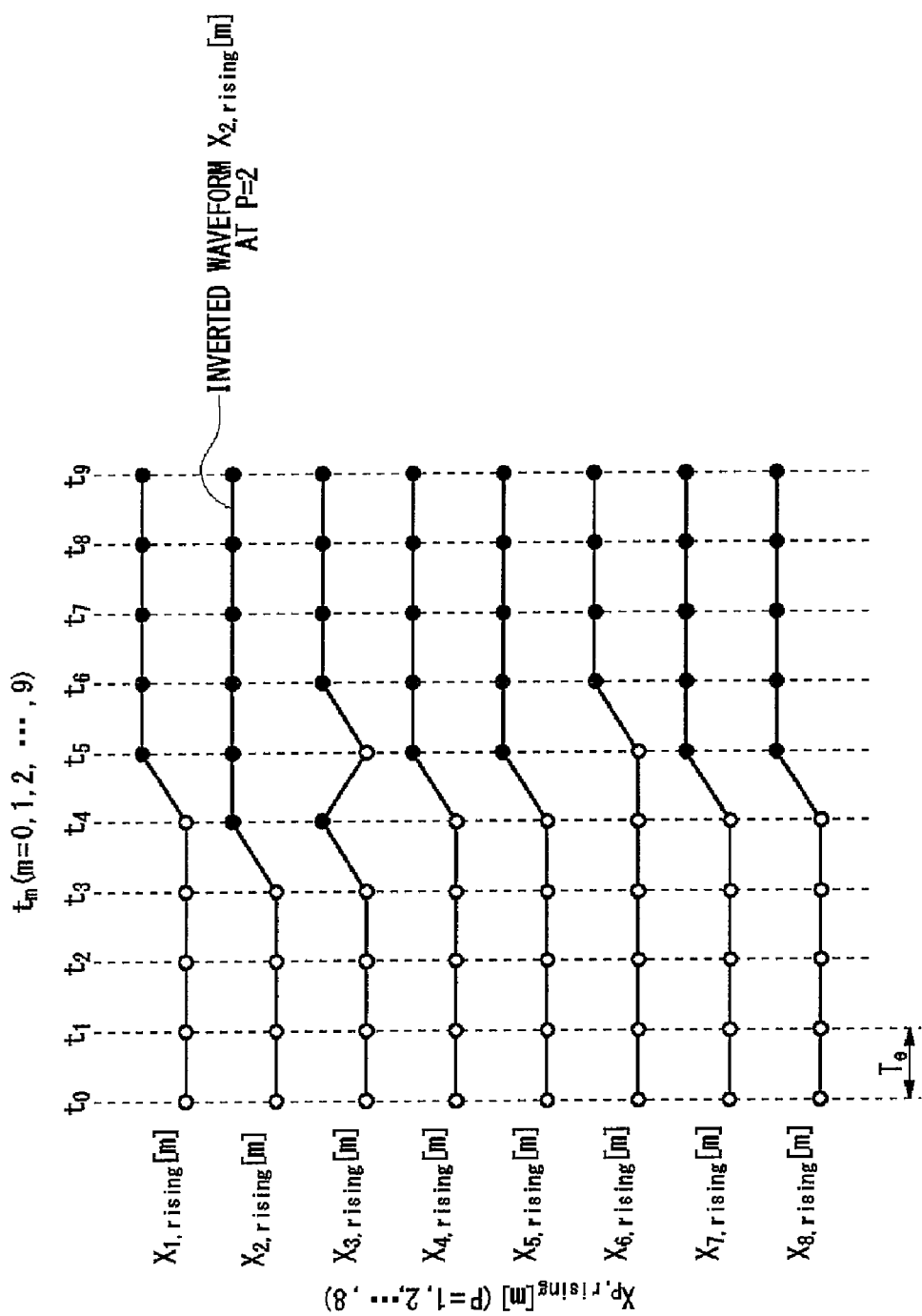
FIG. 8 shows an example in which a portion of the unit-interval waveforms in the signal under measurement 10 are inverted.

FIG. 8 shows an example in which portions of the unit-interval waveforms shown in FIG. 7 are inverted. FIG. 8 is used to describe the general processes performed by the unit-interval waveform group selecting section 204 and the waveform inverting section 206. The unit-interval waveform group selecting section 204 selects only the unit-interval waveforms $X_p[m]$ having falling edges in FIG. 7. The waveform inverting section 206 inverts the logic values of the unit-interval waveforms $X_p[m]$ selected by the unit-interval waveform group selecting section 204 to obtain inverted waveforms $X_{p,\,rising}[m]$. In this way, the inverted waveforms $X_{p,\,rising}[m]$ of FIG. 8 all have rising edges. The unit-interval waveform group selecting section 204 may instead select only the unit-interval waveforms $X_p[m]$ having rising edges, and the waveform inverting section 206 may invert the logic values of these unit-interval waveforms $X_p[m]$ so that all of the inverted waveforms have falling edges.

Figure 9:
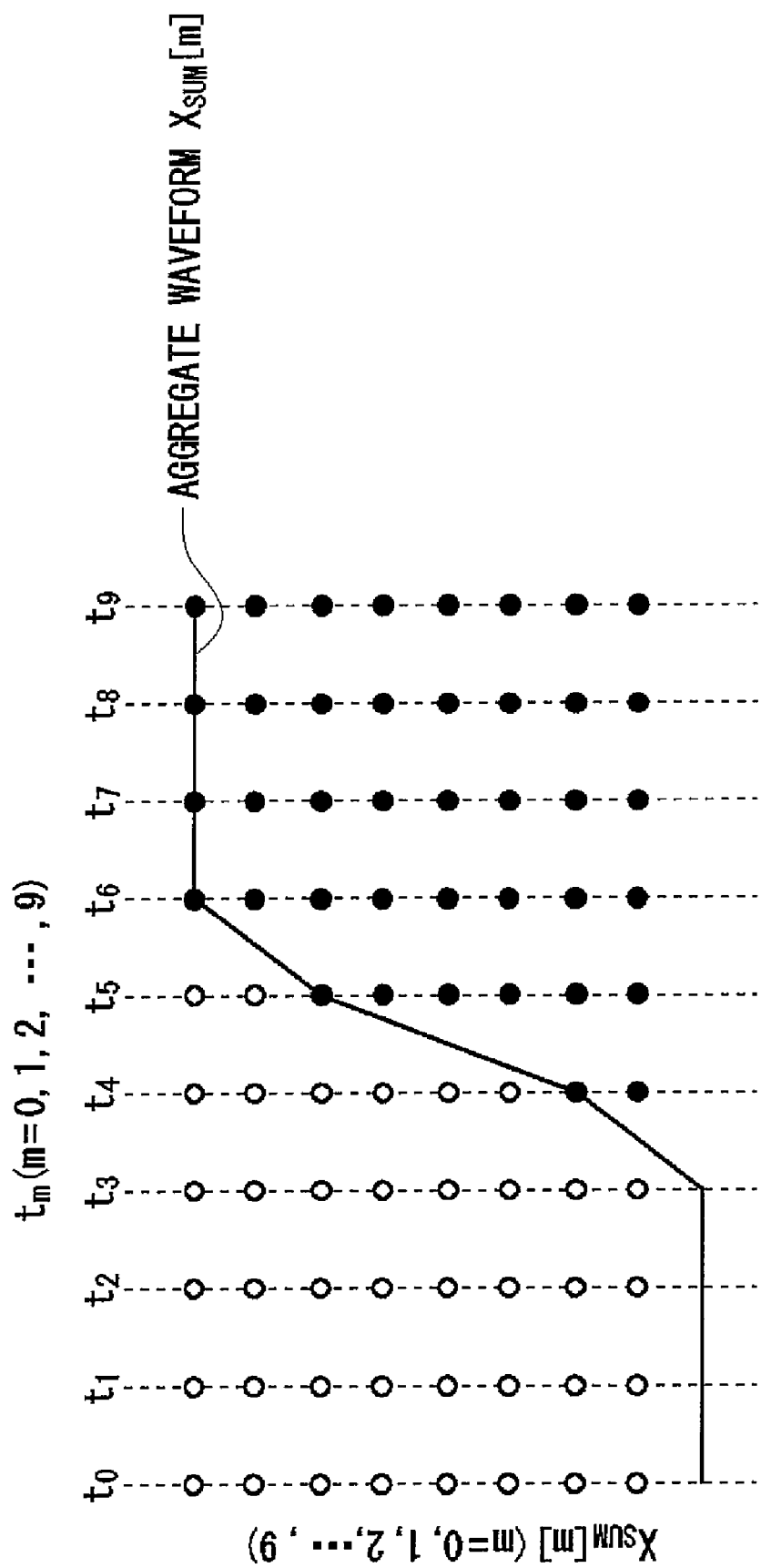
FIG. 9 shows an example of an aggregate waveform obtained by adding together the unit-interval waveforms in the signal under measurement 10.

FIG. 9 shows an example of an aggregate waveform $X_{SUM}[m]$ obtained by adding the unit-interval waveforms of FIG. 8 together. FIG. 9 is used to describe the general process performed by the aggregate value calculating section 208. The aggregate waveform $X_{SUM}[m]$ can be obtained by adding together the logic values of the inverted waveforms $X_{p,\,rising}[m]$ from p=1 to p=8 at each ordinal rank after division m and calculating the aggregate value at each ordinal rank after division m, for example. In FIG. 9, the aggregate values from $X_{SUM}[0]$ to $X_{SUM}[3]$ are 0, the aggregate value of $X_{SUM}[4]$ is 2, the aggregate value of $X_{SUM}[5]$ is 6, the aggregate values of $X_{SUM}[6]$ to $X_{SUM}[9]$ are 8. From this, it is understood that the edge timing is between m=3 and m=6. It should be noted that since the sample values are expressed as binary logic values when the ADC with a 1-bit resolution is used, the aggregate value is equivalent to a count value.

Figure 10:
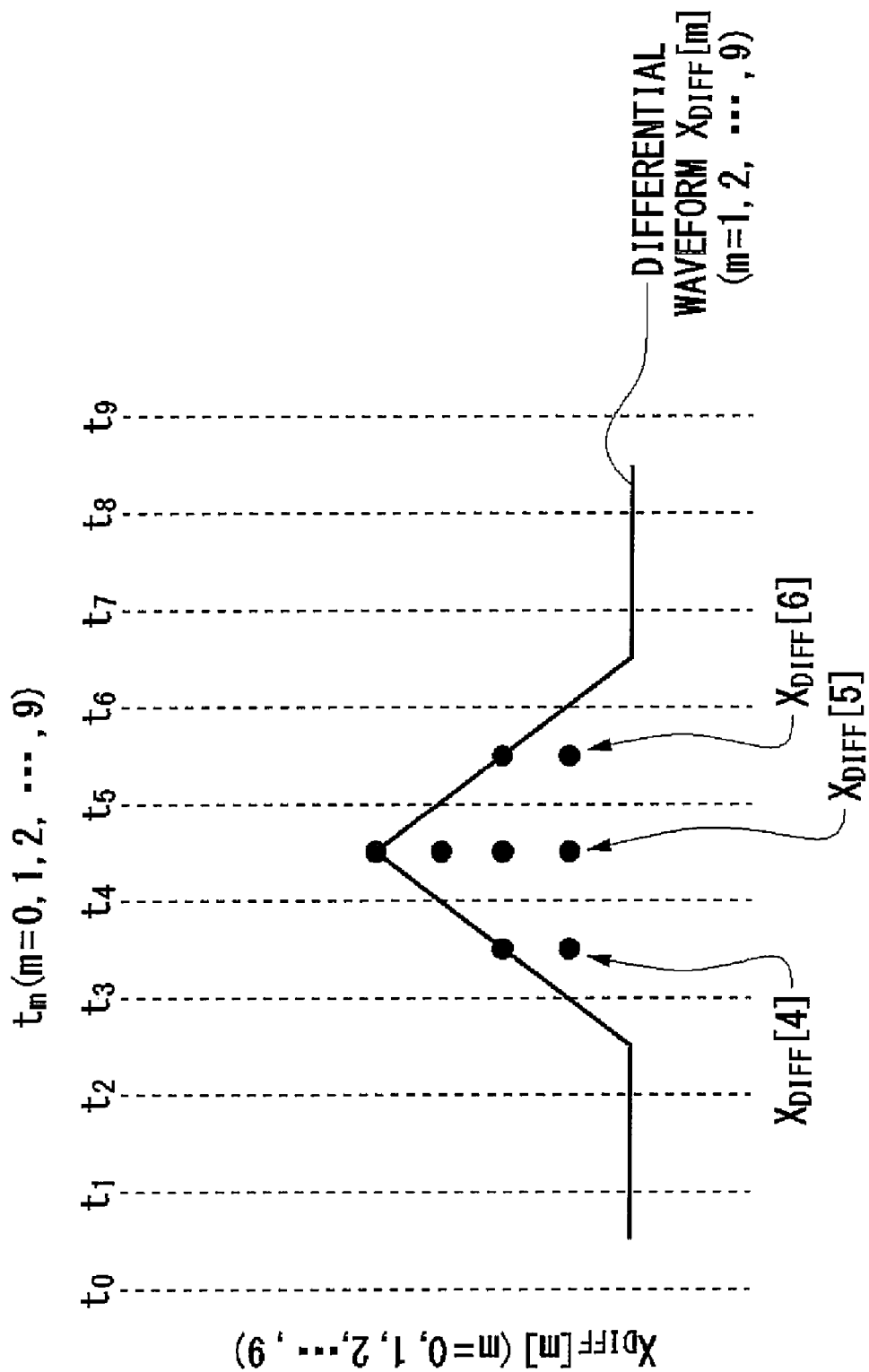
FIG. 10 shows an example of a differential waveform obtained by differentiating the aggregate waveform.

FIG. 10 shows an example of a differential waveform $X_{DIFF}[m]$ obtained by differentiating the aggregate waveform $X_{SUM}[m]$. FIG. 10 is used to describe the general process of the difference calculating section 210. The differential waveform $X_{DIFF}[m]$ is obtained by calculating the differences between the aggregate values of the aggregate waveform $X_{SUM}[m]$ at each ordinal rank m and the aggregate values of the aggregate waveform $X_{SUM}[m-1]$ at each ordinal rank m−1 adjacent to a certain ordinal rank m, for example.

The differential waveform $X_{DIFF}[m]$ is an example of the edge timing distribution. As shown in FIG. 10, the waveform $X_{DIFF}[4]$ at m=4 is 2, the waveform $X_{DIFF}[5]$ at m=5 is 4, waveform $X_{DIFF}[6]$ at m=6 is 2, and the values of $X_{DIFF}[m]$ at the other ordinal ranks after division m are 0. From this, it is understood that the edge timing is between m=3 and m=6.

Figure 11:
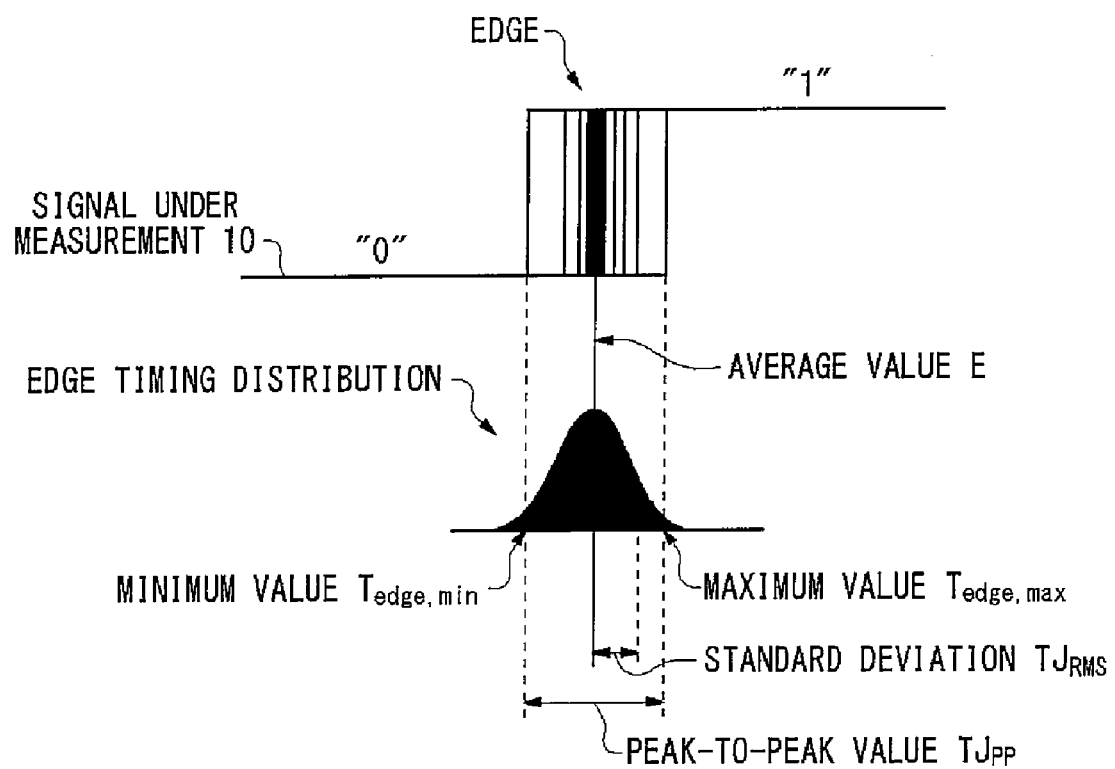
FIG. 11 shows an example of the edge timing distribution.

FIG. 11 is a block diagram showing an example of the edge timing distribution. FIG. 11 is used to describe the general process performed by the statistical value calculating section 146. The statistical value calculating section 146 may use Expression 4 to calculate an average value E of the edge timing distribution of the signal under measurement 10 based on the differential waveform $X_{DIFF}[m]$. By doing this, the statistical value calculating section 146 can obtain an average value of the edge timing of the signal under measurement 10. In Expression 4, $t_m$ represents a sampling time of the signal under measurement 10, and is expressed by $t_m$=m·Te. Furthermore, $\max(X_{SUM}[m])$ represents the maximum value of $X_{SUM}[m]$.

$$E = \sum_{m=0}^{\frac{Tu}{Te}-1} t_m \cdot \frac{X_{DIFF}[m]}{\max(X_{sum}[m])} \qquad \text{Expression 4}$$

The statistical value calculating section 146 may use Expression 5 to calculate a standard deviation $TJ_{RMS}$. The statistical value calculating section 146 may use Expression 6 to calculate a peak-to-peak value $TJ_{PP}$. In this way, the statistical value calculating section 146 can obtain a measurement value of the timing jitter of the signal under measurement 10. FIGS. 5 to 11 described the operation of the waveform processing section 140 with regards to a clock signal, but the operation of the waveform processing section 140 is not limited to a clock signal. In Expression 6, $\max(t_m|x_{DIFF}\neq0)$ represents the maximum time $t_m$ at which $X_{DIFF}[m]$ is not zero, and $\min(t_m|x_{DIFF}\neq0)$ represents the minimum time $t_m$ at which $X_{DIFF}[m]$ is not zero.

$$TJ_{RMS} = \sqrt{\sum_{m=0}^{\frac{Tu}{Te}-1} \left\{ (t_m - E)^2 \cdot \frac{X_{DIFF}[m]}{\max(X_{sum}[m])} \right\}} \qquad \text{Expression 5}$$

$$TJ_{PP} = T_{edge,\,max} - T_{edge,\,min}$$

$$TJ_{PP} = \max(t_m|x_{DIFF}\neq0) - \min(t_m|x_{DIFF}\neq0) \qquad \text{Expression 6}$$

Figure 12:
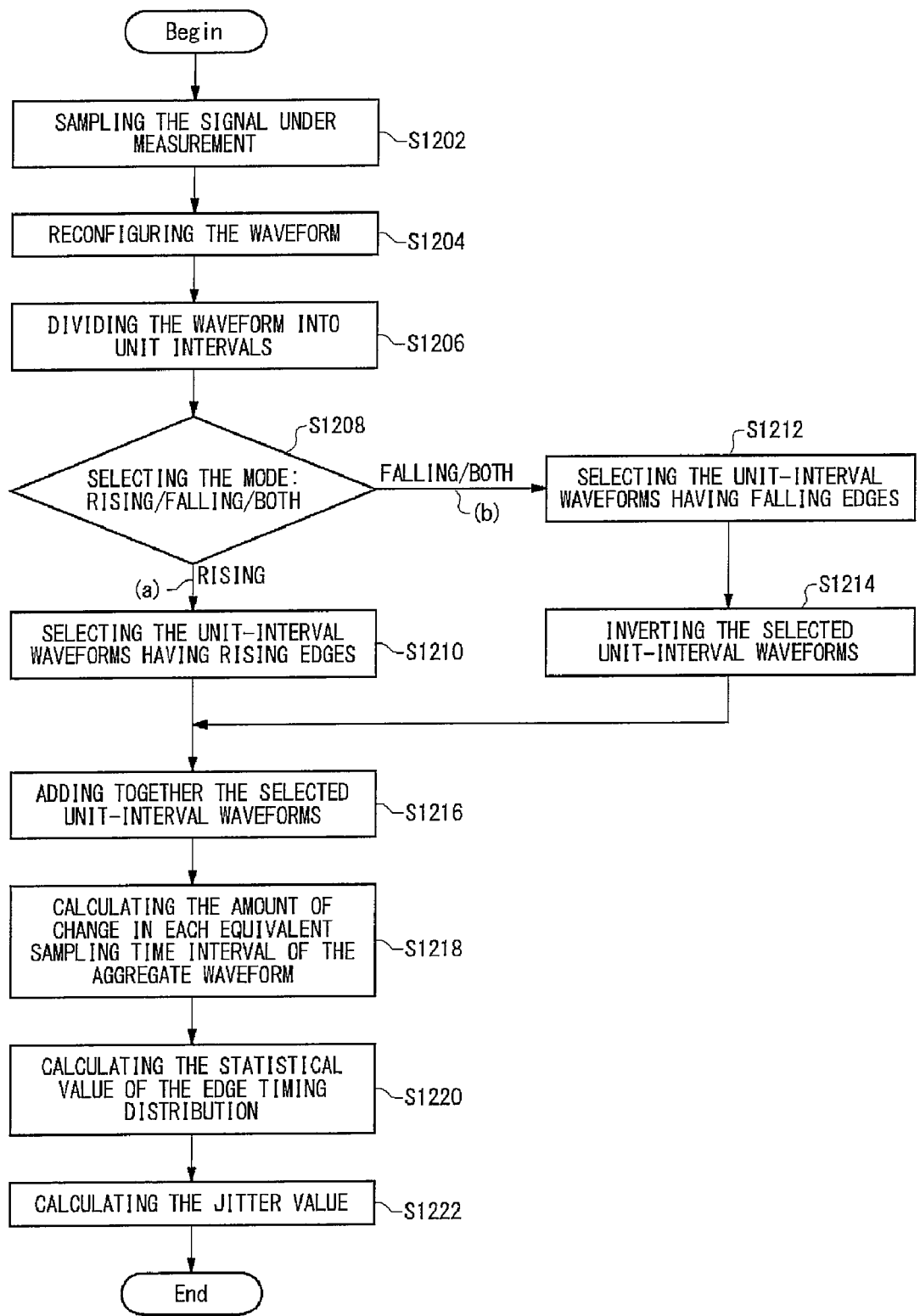
FIG. 12 shows the order of the processes performed by the jitter measurement apparatus 100.

FIG. 12 is a flow chart showing the order of the processes performed by the jitter measurement apparatus 100. FIG. 12 is used to describe the performance of the jitter measurement apparatus 100. At S1202, the sampling section 110 samples the signal under measurement 10 having a cycle T to obtain the sample values of the input waveform $X_S[k]$. The sampling section 110 samples the signal under measurement 10 with a condition that the sampling is performed N times while the signal under measurement 10 repeats for M cycles, where M and N are coprime. The thus obtained sample values may be stored in the memory 120.

At S1204, the waveform reconfiguring section 142 reconfigures the input waveform $X_S[k]$ to generate the reconfigured waveform $X_R[i]$. The waveform reconfiguring section 142 may reconfigure the input waveform $X_S[k]$ by acquiring the sample values stored in the memory 120 and rearranging the initial ordinal ranks k to be the reconfigured ordinal ranks i using the calculation i=(k·M) mod N. At S1206, the unit-interval waveform generating section 202 divides the reconfigured waveform $X_R[i]$ into unit intervals Tu to obtain a plurality of unit-interval waveforms $X_p[m]$.

At S1208, a target is selected for calculating the edge timing distribution from among the plurality of unit-interval waveforms $X_p[m]$ obtained at S1206. The selection mode may be a mode for selecting only the unit-interval waveforms $X_p[m]$ having rising edges, a mode for selecting only the unit-interval waveforms $X_p[m]$ having falling edges, or a mode for selecting all of the unit-interval waveforms $X_p[m]$.

If the mode used at S1208 is a mode selecting only the unit-interval waveforms $X_p[m]$ having rising edges ((a) at S1208), the unit-interval waveforms $X_p[m]$ having rising edges are selected to generate the unit-interval waveform group at S1210. For example, the unit-interval waveform group selecting section 204 may generate the group of unit-interval waveforms $X_p[m]$ having rising edges by selecting only the unit-interval waveforms $X_p[m]$ having rising edges from among the plurality of unit-interval waveforms $X_p[m]$ obtained at S1206.

On the other hand, if the mode used at S1208 is a mode selecting only the unit-interval waveforms $X_p[m]$ having falling edges or for selecting all of the unit-interval waveforms $X_p[m]$ ((b) at S1208), the unit-interval waveforms $X_p[m]$ having falling edges are selected to generate the unit-interval waveform group at S1212. For example, the unit-interval waveform group selecting section 204 may generate the group of unit-interval waveforms $X_p[m]$ having falling edges by selecting only the unit-interval waveforms $X_p[m]$ having falling edges from among the plurality of unit-interval waveforms $X_p[m]$ obtained at S1206. At S1214, the waveform inverting section 206 inverts the waveform of the group of unit-interval waveforms having falling edges.

At step S1216, the aggregate value calculating section 208 adds the logic values of the unit-interval waveforms $X_p[m]$, which are selected by the unit-interval waveform group selecting section 204 at S1208 according to the mode, at each ordinal rank after division m to obtain the aggregate waveform $X_{SUM}[m]$. At S1218, the difference calculating section 210 differentiates the aggregate waveform $X_{SUM}[m]$ to obtain the differential waveform $X_{DIFF}[m]$. The differential waveform $X_{DIFF}[m]$ can be obtained by calculating the amount of change in the aggregate waveform $X_{SUM}[m]$ for each equivalent sampling time interval Te, for example. The amount of change in the aggregate waveform $X_{SUM}[m]$ can be obtained from the differences between the aggregate values of the aggregate waveform $X_{SUM}[m]$ at each ordinal rank m and the aggregate values of the aggregate waveform $X_{SUM}[m-1]$ at each ordinal rank m−1 adjacent to a certain ordinal rank m, for example.

At S1220, the statistical value calculating section 146 calculates the statistical value of the edge timing distribution based on the differential waveform $X_{DIFF}[m]$ obtained at S1218. The statistical value of the edge timing distribution may be the average value E, the standard deviation $TJ_{RMS}$, or the peak-to-peak value $TJ_{PP}$ of the edge timing distribution. Lastly, at S1222, the jitter calculating section 130 calculates the standard deviation $TJ_{RMS}$ or the peak-to-peak value $TJ_{PP}$ of the edge timing distribution as the jitter value and ends the process.

Figure 13:
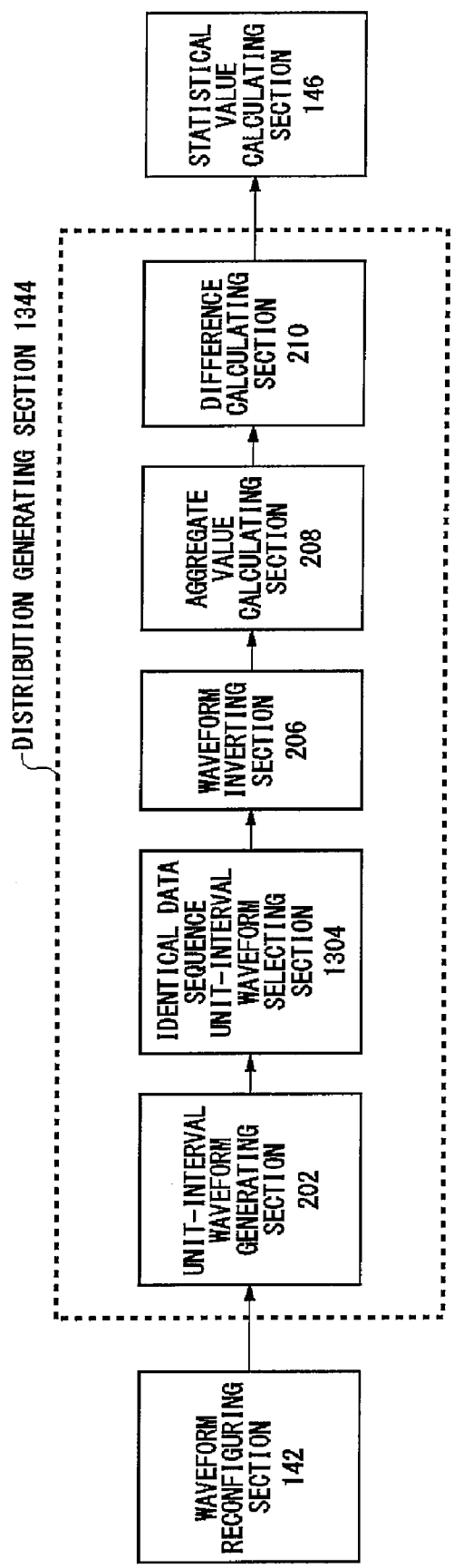
FIG. 13 shows another exemplary configuration of the distribution generating section 144.

FIG. 13 is a block diagram showing another exemplary configuration of the distribution generating section 144. A distribution generating section 1344 has an identical data sequence unit-interval waveform group selecting section 1304 instead of a unit-interval waveform group selecting section 204, but is otherwise identical to the distribution generating section 144. The identical data sequence unit-interval waveform group selecting section 1304 selects a group of unit-interval waveforms having identical data sequences of the sample values in the signal under measurement 10 immediately prior thereto, from among the unit-interval waveforms $X_p[m]$ generated by the unit-interval waveform generating section 202. The aggregate value calculating section 208 adds together the logic values of the sample values for each unit-interval waveform in the group selected by the identical data sequence unit-interval waveform group selecting section 1304, instead of for each unit-interval waveform in the group selected by the unit-interval waveform group selecting section 204.

Figure 14:
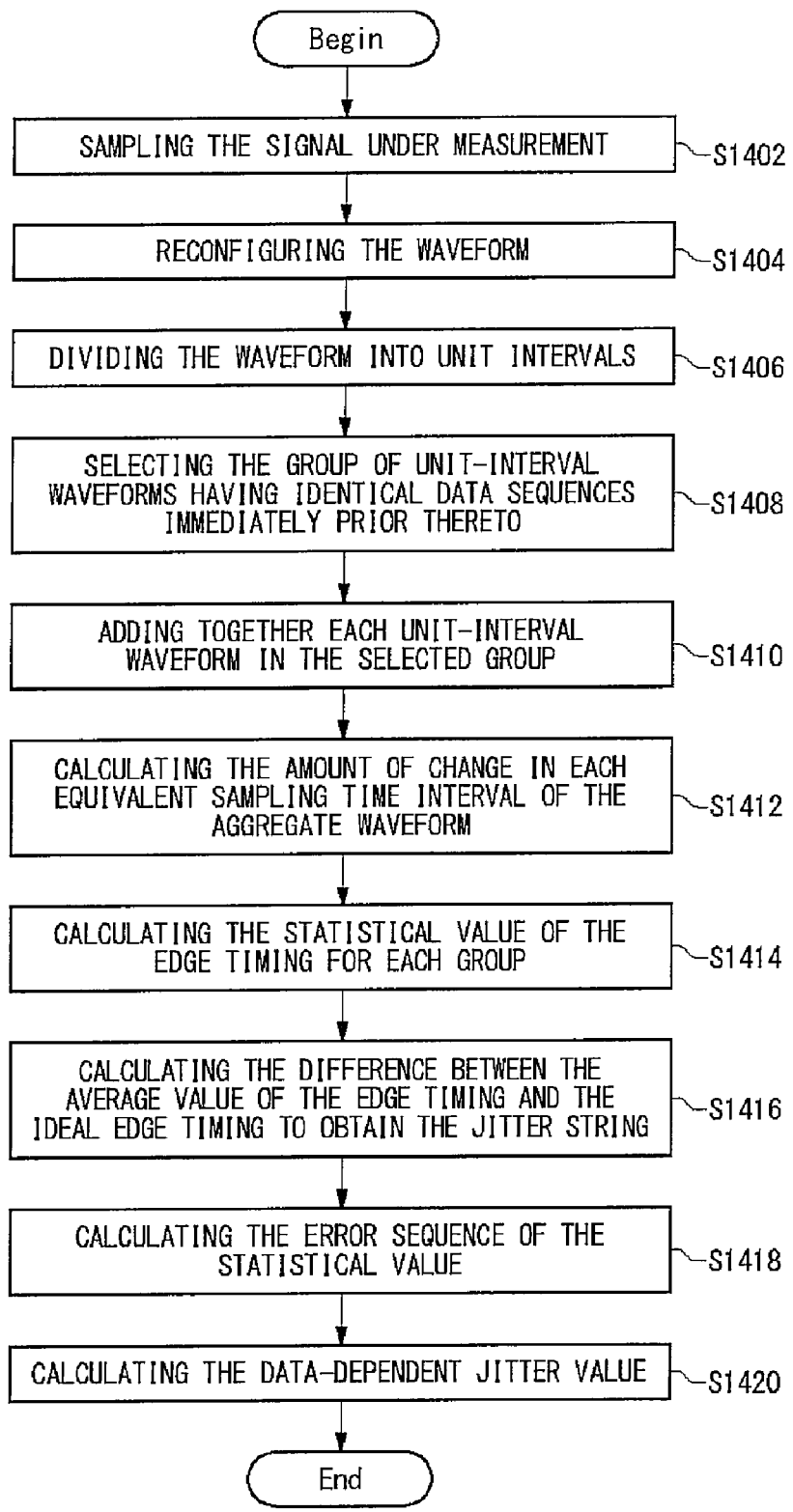
FIG. 14 shows the order of the process performed by another embodiment.

FIG. 14 is a flow chart showing the order of the process performed by the distribution generating section 1344 of FIG. 13. FIG. 14 is used to describe a process of using the identical data sequence unit-interval waveform group selecting section 1304 to calculate data-dependent jitter when the signal under measurement 10 repeats an L-bit data pattern. Here, L represents a positive integer. The process from S1402 to S1406 is identical to the process from S1202 to S1206, and therefore a description is omitted. The process from S1410 to S1414 is identical to the process from S1216 to S1220, except for the processing of the identical data sequence unit-interval waveform group selected at S1408, and therefore a description of the identical portions is omitted.

At S1408 in the present embodiment, the identical data sequence unit-interval waveform group selecting section 1304 generates the group of identical data sequence unit-interval waveforms, each having immediately prior data sequences that are identical to the data sequence immediately prior to the edge being measured. The identical data sequence unit-interval waveform group can be generated as described hereinafter, for example. First, the reconfigured waveform $X_R[i]$ is divided into bit periods Tb. The identical data sequence unit-interval waveform group selecting section 1304 then selects a specific edge to be measured from among the edges in the signal under measurement 10. The identical data sequence unit-interval waveform group selecting section 1304 selects only the unit-interval waveforms having the same data sequence for L-bits immediately prior thereto as that of the specific edge, from among all of the unit-interval waveforms, and extracts the selected unit waveforms. In this way, the data sequence unit-interval waveform group selecting section 1304 can generate the group of identical data sequence unit-interval waveforms, each having immediately prior data sequences that are identical to the data sequence immediately prior to the edge being measured.

From S1410 to S1414, the edge timing distribution and the average value of the edge timing distribution are calculated for each unit-interval waveform included in the identical data sequence unit-interval waveform group obtained at S1304, in the same manner as the process from S1216 to S1220. In this way, the average value of the edge timing of the specific edge can be calculated. The average value of the edge timing for each of the plurality of edges in the signal under measurement 10 can be calculated by the process from S1408 to S1414 as shown above. The process from S1408 to S1414 may be performed for all of the edges in the signal under measurement 10.

At S1416, the S160 calculates the difference between the average value of the edge timing of the specific edge calculated by the statistical value calculating section 146 at S1414 and the ideal edge timing of the specific edge calculated by the ideal edge timing calculating section 150. In this way, the error between the timing of the specific edge and the ideal edge timing can be calculated. In the same way, the error between the timing of a specific edge and the ideal edge timing can be calculated for each of the plurality of edges having average values of their edge timings calculated at S1414. In this way, the error sequence DDJ[j] can be generated in which the errors described above are arranged in a time series. Here, j represents the ordinal ranks of the errors in the error DDJ[j], and may be a positive integer from 1 to $N_{edge}$.

At S1418, the statistical value of the error sequence DDJ[j] is calculated. The statistical value may be the RMS value shown by Expression 7 or the peak-to-peak value shown by Expression 8. The Fourier transform section 180 may perform a Fourier transform to convert the error sequence DDJ[j] oriented on the time axis into a signal in the frequency domain. Lastly, at S1420, the jitter calculating section 130 calculates the RMS value $DDJ_{RMS}$ or the peak-to-peak value $DDJ_{PP}$ of the error sequence DDJ[j] as the jitter value and ends the process.

$$DDJ_{RMS} = \sqrt{\frac{1}{M} \sum_{j=1}^{N_{edge}} DDJ^2[j]}$$  Expression 7

$$DDJ_{PP} = \max(DDJ[j]) \cdot \min(DDJ[j])$$  Expression 8

Figure 15:
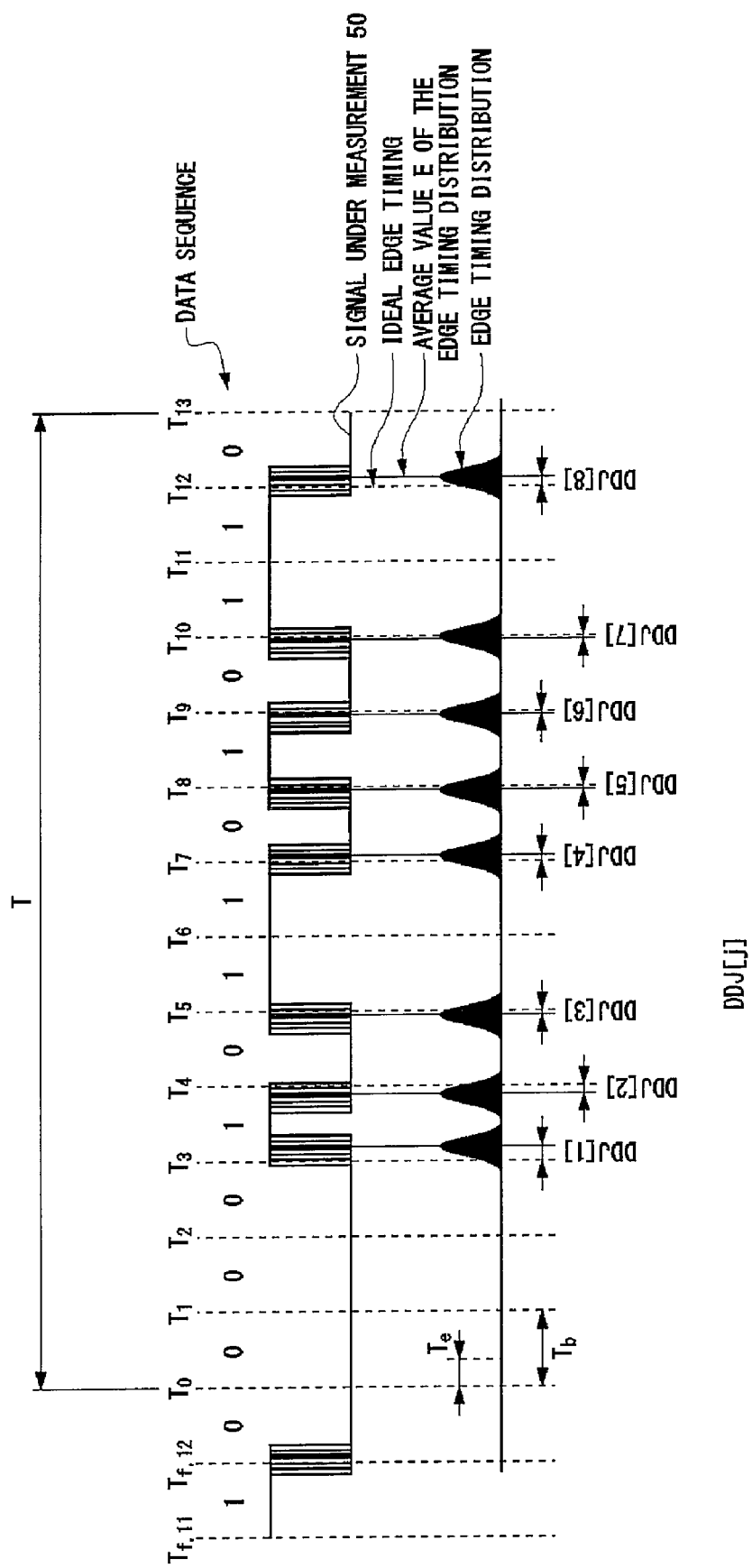
FIG. 15 shows the edge timing distribution of another embodiment.

FIG. 15 shows the edge timing distribution of the embodiment described above when a data signal having a repeating 13-bit data sequence is input as a signal under measurement 50. The signal under measurement 50 may be sampled at intervals that are integer multiples of M·T. In FIG. 15, $T_0$, $T_1$, $T_2$, ..., $T_{13}$ represent the timing of the bit boundaries, and each time interval is equal to the bit period Tb. Furthermore, $T_{f,11}$ and $T_{f,12}$ represent the bit boundaries of the immediately prior cycle.

As shown in FIG. 15, the cycle T of the signal under measurement 50 is equal to 13Tb, and the signal under measurement 50 has eight edges within the cycle T. The error sequence DDJ[j] (j=1, 2, ..., 8) is obtained by obtaining the edge timing distribution for each edge and calculating the error between each obtained edge timing and the ideal edge timing for each edge. When the edge at $T_{12}$ is being measured, for example, the group of identical data sequence unit-interval waveforms having data sequences immediately prior thereto which are identical to the data sequence immediately prior to the edge at $T_{12}$ is generated by selecting the bit period that includes $T_{f,12}$ or $T_{12}$ as the unit-interval waveform. The timing distribution can be obtained for each of the edges in the same manner.

Only the bit periods including $T_{12}$, such as $T_{f,12}$ and $T_{12}$, are selected in the present embodiment, but the present invention is not limited to such. For example, the edge corresponding to DDJ[3] and the edge corresponding to DDJ[7] have the same immediately prior data sequence "010". Therefore, the bit period including $T_5$ and the bit period including $T_{10}$ may be selected to generate the identical data sequence unit-interval waveform group.

The present embodiment describes an example using the identical data sequence unit-interval waveform group selecting section 1304 instead of the unit-interval waveform group selecting section 204, but both the identical data sequence unit-interval waveform group selecting section 1304 and the unit-interval waveform group selecting section 204 may also be used. Instead of the identical data sequence unit-interval waveform group selecting section 1304, a prescribed bit unit-interval waveform group selecting section may be used that selects unit-interval waveforms generated by the unit-interval waveform generating section 202 at prescribed bit intervals in the signal under measurement 50. The aggregate value calculating section 208 may add the sample values of the unit-interval waveforms having falling edges that are inverted by the waveform inverting section 206 to the sample values of the unit-interval waveforms having rising edges for each prescribed bit unit-interval waveform in the group selected by the prescribed bit unit-interval waveform group selecting section. Furthermore, the jitter measurement apparatus 100 may include both the prescribed bit unit-interval waveform group selecting section and the unit-interval waveform group selecting section 204.

The above description discloses a jitter measurement method including the steps of sampling the signal under measurement 10 having a cycle T, shaping a reconfigured waveform having the cycle T by rearranging the order of the sample values obtained at the sampling step, generating a timing distribution of a portion of the edges in the reconfigured waveform, and calculating the statistical value of the timing distribution. Furthermore, a jitter measurement method is disclosed for, at the sampling step described above, sampling the signal under measurement a certain number of times N while the signal under measurement having the cycle T repeats for M cycles, where M and N are coprime. Yet further, a jitter measurement method is disclosed for, at the reconfiguring step described above, rearranging the order of the sample values obtained at the sampling step to have reconfigured ordinal ranks i by inputting the initial ordinal ranks k into the expression i=k·M mod N, where k is expressed by integers from 0 to N−1, and using these rearranged sample values to shape a reconfigured waveform having the cycle T.

Figure 16:
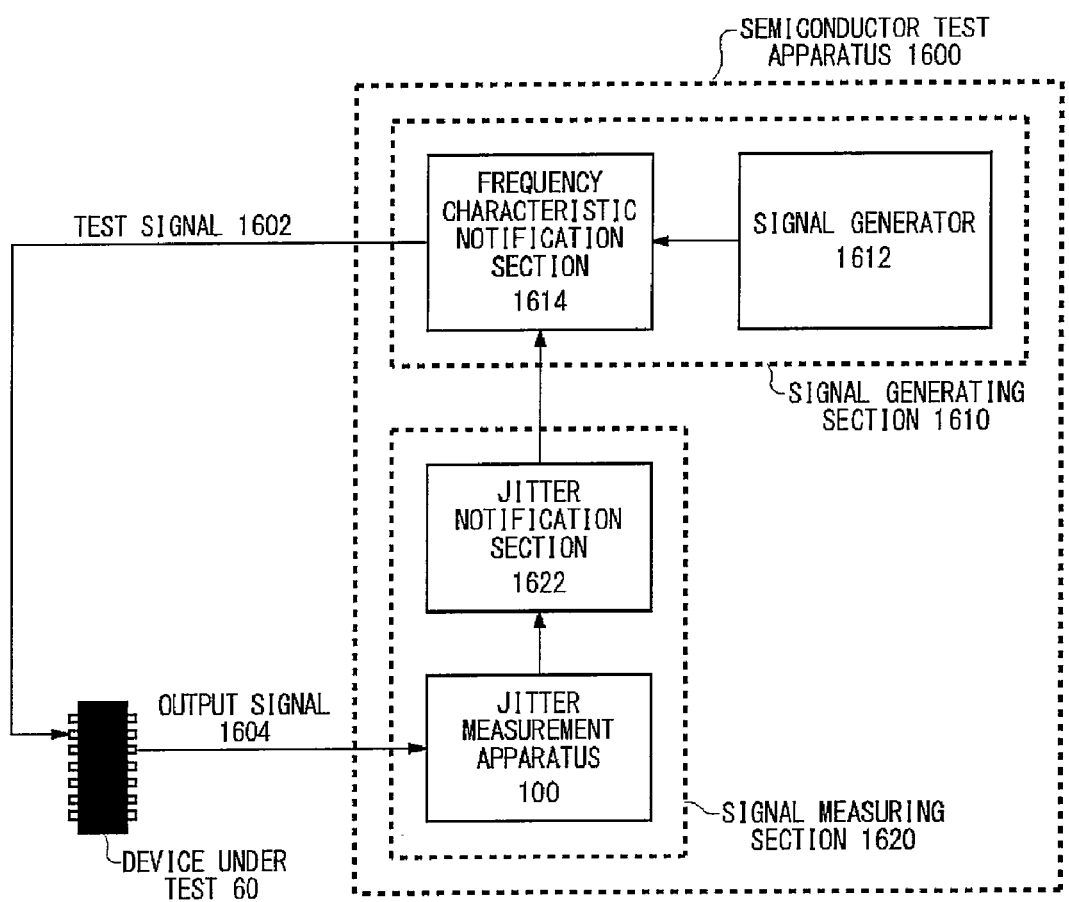
FIG. 16 shows an exemplary configuration of a semiconductor test apparatus 1600.

FIG. 16 is a block diagram showing an exemplary configuration of a semiconductor test apparatus 1600. The semiconductor test apparatus 1600 is an example of a test apparatus. The semiconductor test apparatus 1600 provides a test signal 1602 to a device under test 60 to test the device under test 60. The semiconductor test apparatus 1600 is provided with a signal generating section 1610 and a signal measuring section 1620. The signal generating section 1610 generates the test signal 1602. The signal measuring section 1620 measures an output signal 1604 of the device under test 60. The output signal 1604 has a cycle T. The signal generating section 1610 includes a signal generator 1612 and a frequency characteristic adjusting section 1614. The signal measuring section 1620 includes the jitter measurement apparatus 100 and a jitter value notification section 1622.

The signal generator 1612 generates the test signal 1602. The frequency characteristic adjusting section 1614 adjusts the frequency characteristic of the test signal 1602 to decrease the jitter value of the output signal 1604 in accordance with the jitter value of the output signal 1604 measured by the signal measuring section 1620. The frequency characteristic adjusting section 1614 may adjust the frequency characteristic of the test signal 1602 according to the jitter value indicated by notification from the jitter value notification section 1622. For example, if the jitter value indicated by the notification from the jitter value notification section 1622 is greater than a prescribed value, the frequency characteristic adjusting section 1614 adjusts an equalizer, not shown, to enhance the high frequency component of the test signal 1602. The sampling section 110 of the jitter measurement apparatus 100 samples the output signal 1604 a certain number of times N while the output signal 1604 repeats for M cycles, where M and N are coprime. The jitter value notification section 1622 notifies the signal generating section 1610 concerning the jitter value of the output signal 1604, which is the statistical value calculated by the statistical value calculating section 146 of the jitter measurement apparatus 100.

Figure 17:
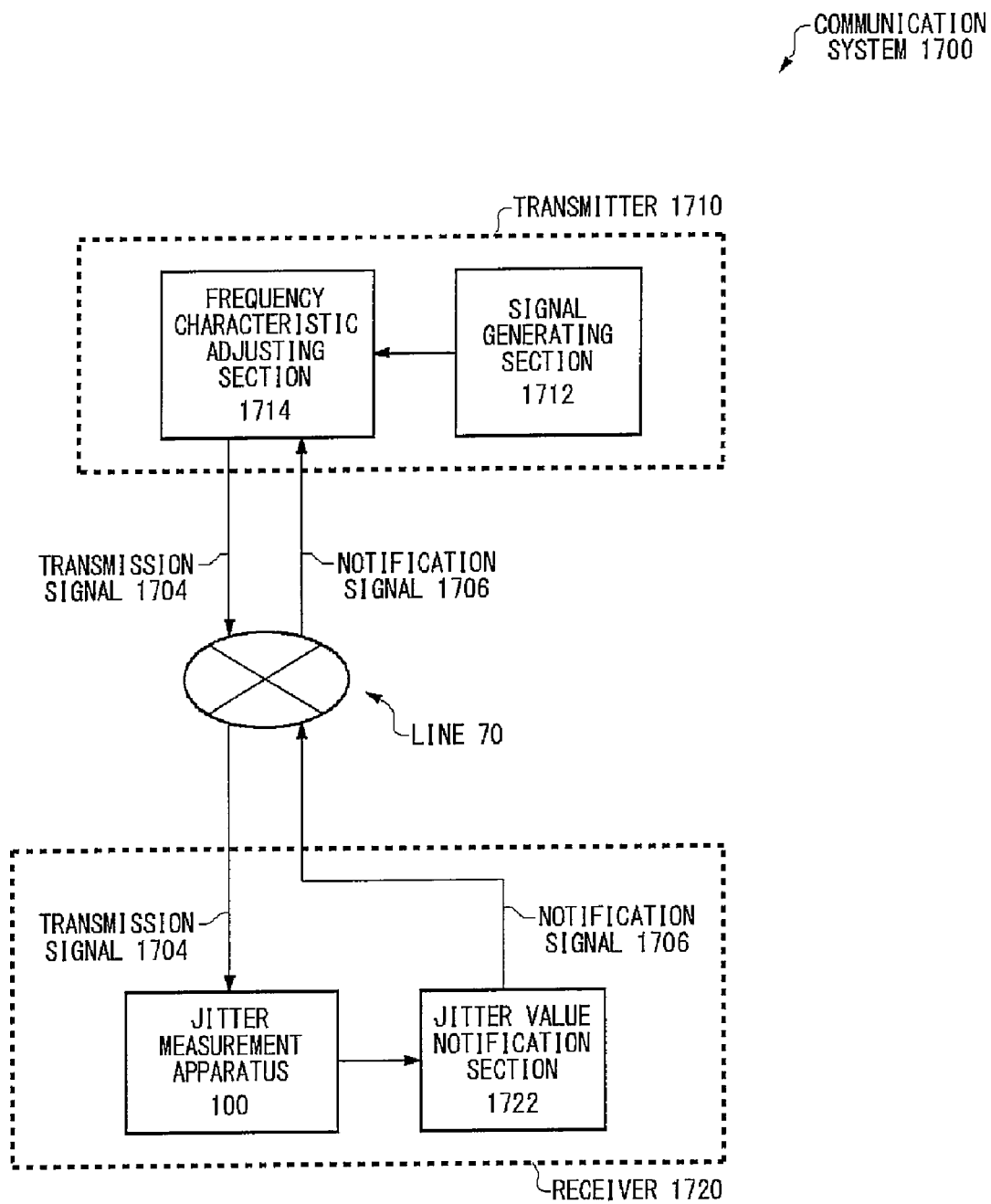
FIG. 17 shows an exemplary configuration of the communication system 1700.

FIG. 17 is a block diagram showing an exemplary configuration of a communication system 1700. The communication system 1700 is provided with a transmitter 1710, a receiver 1720, and a line 70 allowing communication between the transmitter 1710 and the receiver 1720. The transmitter 1710 generates a transmission signal 1704. The receiver 1720 receives the transmission signal 1704 via the line 70. The receiver 1720 sends the notification signal 1706 to the transmitter 1710 concerning via the line 70. The transmission signal 1704 has a cycle T. The transmitter 1710 includes a signal generating section 1712 and a frequency characteristic adjusting section 1714. The receiver 1720 includes the jitter measurement apparatus 100 and a jitter value notification section 1722.

The signal generating section 1712 generates the transmission signal 1704. The frequency characteristic adjusting section 1714 adjusts the frequency characteristic of the transmission signal 1704 to decrease the jitter value of the transmission signal 1704 in accordance with the jitter value of the transmission signal 1704 measured by the receiver 1720. The frequency characteristic adjusting section 1714 may adjust the frequency characteristic of the transmission signal 1704 according to the jitter value indicated by the notification from the jitter value notification section 1722. For example, if the jitter value indicated by the notification from the jitter value notification section 1722 is greater than a prescribed value, the frequency characteristic adjusting section 1714 adjusts an equalizer, not shown, to enhance the high frequency component of the transmission signal 1704. The sampling section 110 of the jitter measurement apparatus 100 samples the transmission signal 1704 a certain number of times N while the transmission signal 1704 repeats for M cycles, where M and N are coprime. The jitter value notification section 1722 sends the notification signal 1706 to the transmitter 1710. The jitter value notification section 1722 may notify the transmitter 1710 concerning the jitter value of the transmission signal 1704, which is the statistical value calculated by the statistical value calculating section 146 of the jitter measurement apparatus 100.

Figure 18:
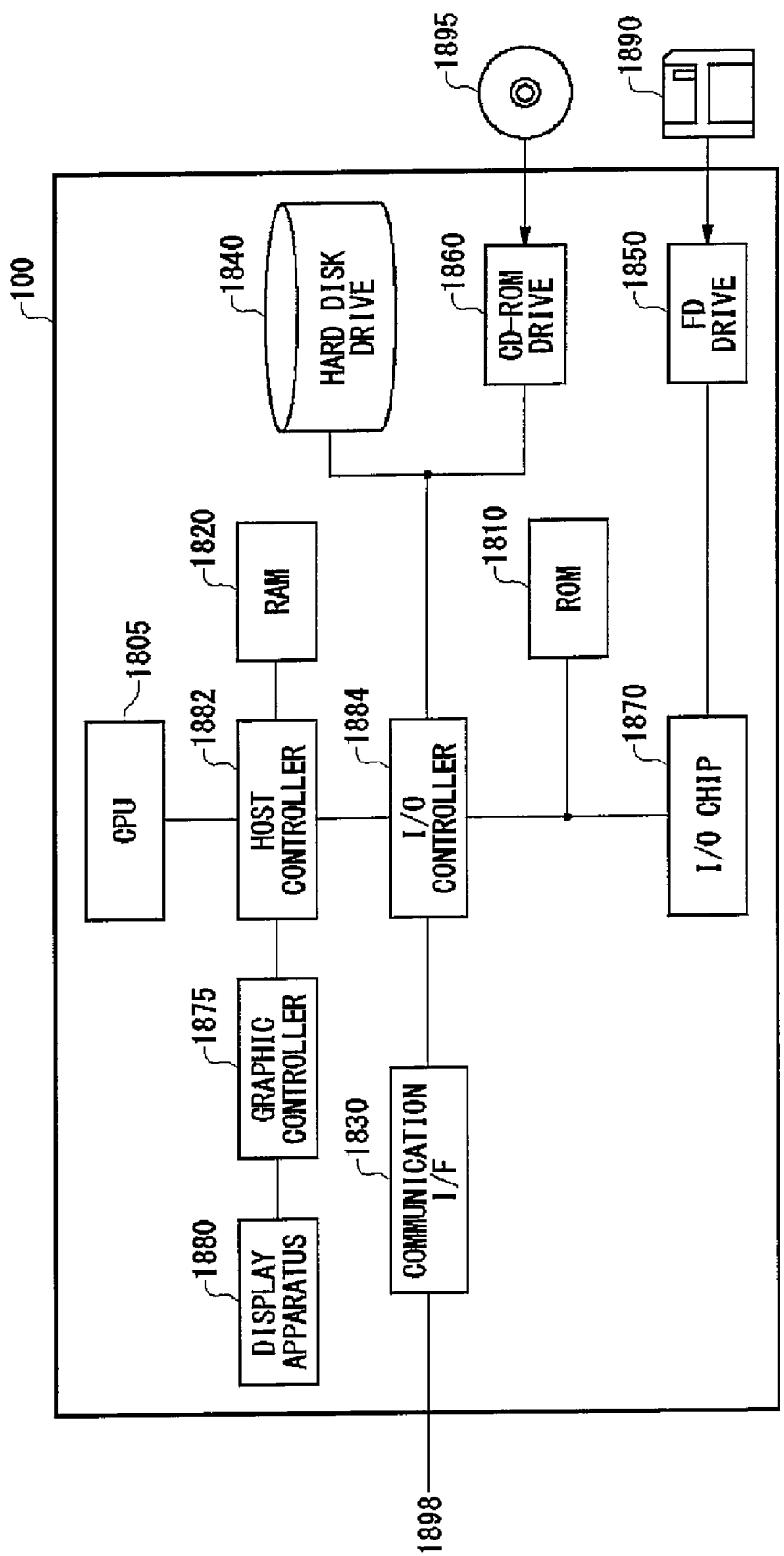
FIG. 18 shows an exemplary hardware configuration of the jitter measurement apparatus 100.

FIG. 18 shows an exemplary hardware configuration of the jitter measurement apparatus 100. More specifically, FIG. 18 shows an exemplary hardware configuration in which the jitter measurement apparatus 100 is an electronic information processing apparatus such as a computer. The jitter measurement apparatus 100 is provided with a CPU peripheral section, an input/output section, and a legacy input/output section. The CPU peripheral section includes a CPU 1805, a RAM 1820, a graphic controller 1875, and a display apparatus 1880 connected to each other by a host controller 1882. The input/output section includes a communication interface 1830, a hard disk drive 1840, and a CD-ROM drive 1860, all of which are connected to the host controller 1882 by an input/output controller 1884. The legacy input/output section includes a ROM 1810, a flexible disk drive 1850, and an input/output chip 1870, all of which are connected to the input/output controller 1884.

The host controller 1882 is connected to the RAM 1820 and is also connected to the CPU 1805 and graphic controller 1875 accessing the RAM 1820 at a high transfer rate. The CPU 1805 operates to control each section based on programs stored in the ROM 1810 and the RAM 1820. The graphic controller 1875 acquires image data generated by the CPU 1805 or the like on a frame buffer disposed inside the RAM 1820 and displays the image data in the display apparatus 1880. Alternatively, the graphic controller 1875 may internally include the frame buffer storing the image data generated by the CPU 1805 or the like.

The input/output controller 1884 connects the hard disk drive 1840 serving as a relatively high speed input/output apparatus, the communication interface 1830, and the CD-ROM drive 1860 to the host controller 1882. The hard disk drive 1840 stores the programs and data used by the CPU 1805. The communication interface 1830 is connected to a network communication apparatus 1898 to receive the programs or the data. The CD-ROM drive 1860 reads the programs and data from a CD-ROM 1895 and provides the read information to the hard disk drive 1840 and the communication interface 1830 via the RAM 1820.

The input/output controller 1884 is connected to the ROM 1810, and is also connected to the flexible disk drive 1850 and the input/output chip 1870 serving as a relatively high speed input/output apparatus. The ROM 1810 stores a boot program performed when the jitter measurement apparatus 100 starts up, a program relying on the hardware of the jitter measurement apparatus 100, and the like. The flexible disk drive 1850 reads the programs or data from a flexible disk 1890 and supplies the read information to the hard disk drive 1840 and the communication interface 1830 via the RAM 1820. The input/output chip 1870 connects the flexible disk drive 1850 to each of the input/output apparatuses via, a parallel port, a serial port, a keyboard port, a mouse port, or the like.

The programs performed by the CPU 1805 are stored on a recording medium such as the flexible disk 1890, the CD-ROM 1895, or an IC card and are provided by the user. The programs stored on the recording medium may be compressed or uncompressed. The programs are installed on the hard disk drive 1840 from the recording medium, are read by the RAM 1820, and are performed by the CPU 1805. The programs performed by the CPU 1805 cause the jitter measurement apparatus 100 to function as the sampling section 110, the waveform reconfiguring section 142, the distribution generating section 144, and the statistical value calculating section 146 described in relation to FIGS. 1 to 17.

The programs shown above may be stored in an external storage medium. In addition to the flexible disk 1890 and the CD-ROM 1895, an optical recording medium such as a DVD or PD, a magneto-optical medium such as an MD, a tape medium, a semiconductor memory such as an IC card, or the like can be used as the recording medium. Furthermore, a storage apparatus such as a hard disk or a RAM disposed in a server system connected to the Internet or a specialized communication network may be used as the storage medium and the programs may be provided to the jitter measurement apparatus 100 via the network.

Figure 19:
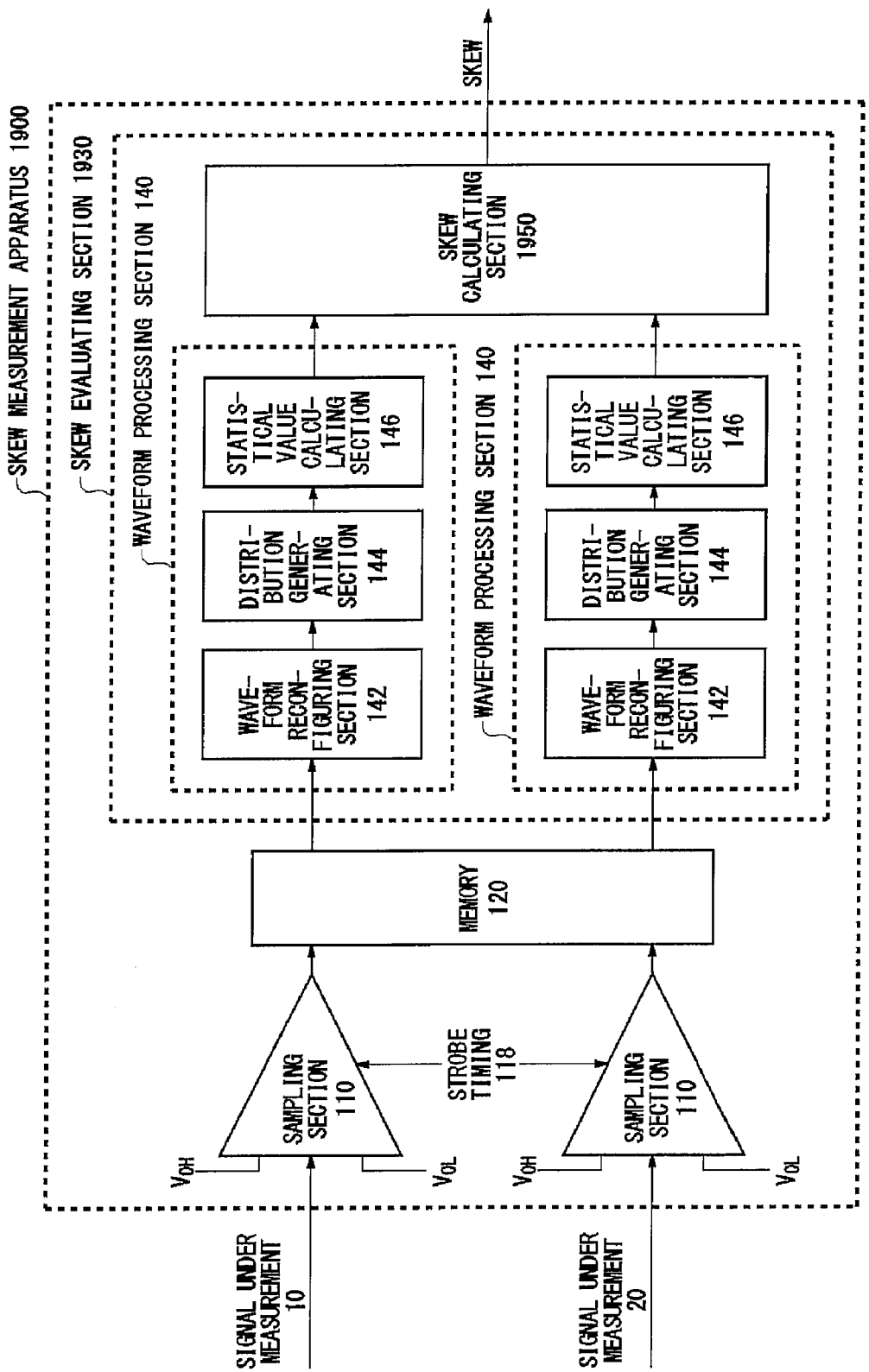
FIG. 19 shows an exemplary configuration of a skew measurement apparatus 1900.

FIG. 19 is a block diagram showing an exemplary configuration of a skew measurement apparatus 1900. As shown in FIG. 19, the skew measurement apparatus 1900 is provided with a plurality of sampling sections 110, the memory 120, and a skew evaluating section 1930. The skew measurement apparatus 1900 may have a configuration identical to that of the jitter measurement apparatus 100 except that the skew measurement apparatus 1900 has a plurality of sampling sections that receive a plurality of signals under measurement as input. The skew evaluating section 1930 includes the waveform processing section 140 and a skew calculating section 1950. The skew evaluating section 1930 may include a plurality of waveform processing sections 140. For example, the waveform processing sections 140 calculate the average values of the edge timings of the signal under measurement 10 and a signal under measurement 20, respectively. The average values of the edge timings are examples of the statistical values of the edge timing distributions. The skew calculating section 1950 calculates the skew value between the signal under measurement 10 and the signal under measurement 20 by obtaining the difference between the average value of the edge timing of the signal under measurement 10 and the average value of the edge timing of the signal under measurement 20.

As a specific example, the skew measurement apparatus 1900 is provided with sampling sections that sample a plurality of signals under measurement, each sampling section sampling the respective signal under measurement having a cycle T for a certain number of cycles N while the signal under measurement repeats for M cycles, where M and N are coprime; waveform reconfiguring sections that rearrange the order of the sample values of each of the signals under measurement sampled by the sampling sections to have reconfigured ordinal ranks i by inputting the initial ordinal ranks k into the expression i=k·M mod N, where k is expressed by integers from 0 to N−1, and that use these rearranged sample values to shape a reconfigured waveform having the cycle T; distribution generating sections that generate timing distributions of the edges in the reconfigured waveform of each signal under measurement; and a skew calculating section that calculates the skew between the signal under measurement being compared based on the timing distributions of the signal under measurement.

Figure 20:
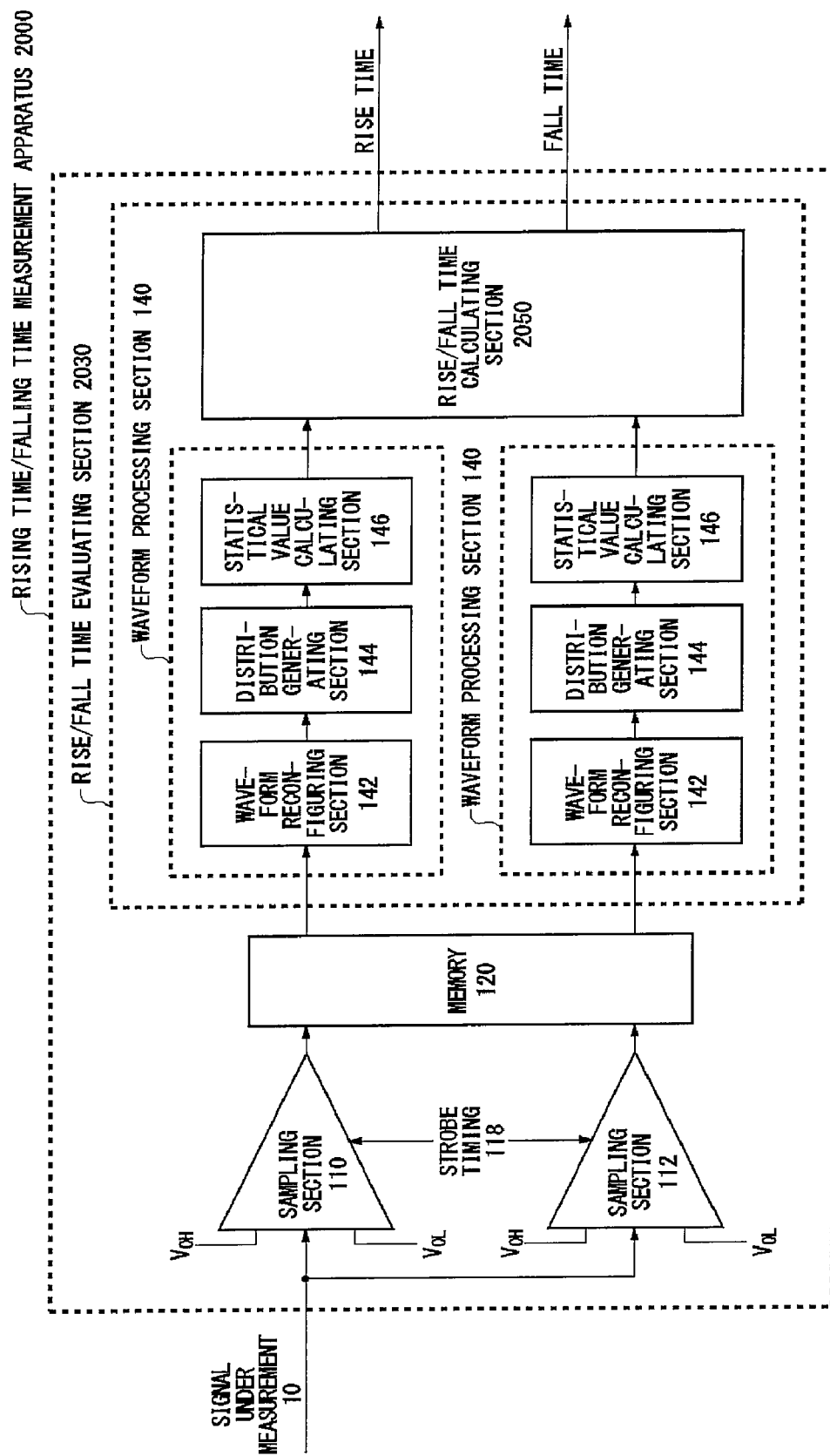
FIG. 20 shows an exemplary configuration of a rise/fall time measurement apparatus 2000.

FIG. 20 is a block diagram showing an exemplary configuration of a rise/fall time measurement apparatus 2000. The rise/fall time measurement apparatus 2000 is an example of the signal measurement apparatus. The rise/fall time can express the edge transition time of the signal under measurement 10, and can be obtained by calculating the timing difference of the 20% level cross-point and the 80% level cross-point of the signal amplitude, for example. The rise/fall time measurement apparatus 2000 can measure the rise/fall time of the signal under measurement 10 by sampling the signal under measurement 10 simultaneously with two comparators having different threshold values to calculate the difference between the average value of the edge timings at the 80% level cross-point and the average value of the edge timings at the 20% level cross-point.

As shown in FIG. 20, the rise/fall time measurement apparatus 2000 is provided with the sampling section 110, the sampling section 112, the memory 120, and a rise/fall time evaluating section 2030. The sampling section 112 has a configuration identical to that of the sampling section 110, except for having a different threshold value. The rise/fall time measurement apparatus 2000 has a configuration identical to that of the jitter measurement apparatus 100, except that the rise/fall time measurement apparatus 2000 measures a single signal under measurement 10 with both the sampling section 110 and the sampling section 112. The rise/fall time evaluating section 2030 includes the waveform processing section 140 and a rise/fall time calculating section 2050. The rise/fall time evaluating section 2030 may include a plurality of waveform processing sections 140.

The waveform processing section 140 may calculate the average value of the edge timings at the 20% level cross-points of the signal under measurement 10 and the average value of the edge timings at the 80% level cross-points of the signal under measurement 10. The average value of the edge timings is an example of the statistical value of the edge timing distribution. The rise/fall time calculating section 2050 can measure the rise time or the fall time of the signal under measurement 10 by calculating the difference between the average value of the edge timings at the 20% level cross-points of the signal under measurement 10 and the average value of the edge timings at the 80% level cross-points of the signal under measurement 10.

As a specific example, the rise/fall time measurement apparatus 2000 is provided with sampling sections that respectively sample the signal under measurement with two different threshold values, each sampling section sampling the signal under measurement for a certain number of cycles N while the signal under measurement having a cycle T that repeats for M cycles, where M and N are coprime; waveform reconfiguring sections that rearrange the order of the sample values of the signal under measurement sampled by the sampling sections to have reconfigured ordinal ranks i by inputting the initial ordinal ranks k into the expression i=k·M mod N, where k is expressed by integers from 0 to N−1, and that use these rearranged sample values to shape a reconfigured waveform having the cycle T; distribution generating sections that generate timing distributions of the edges in the reconfigured waveform for each threshold value; and a calculating section that calculates the rise time or fall time of the signal under measurement based on the timing distributions for the threshold values.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, the embodiments of the present invention can be adopted to realize a jitter measurement apparatus, a jitter measurement method, a recording medium, a communication system, and a test apparatus for measuring timing jitter using a digital comparator such as a voltage comparator.

What is claimed is:

1. A jitter measurement apparatus, comprising:
    a sampling section that samples a signal under measurement having a cycle T;
    a waveform reconfiguring section that shapes a reconfigured waveform having the cycle T by rearranging ordinal ranks of sample values sampled by the sampling section;
    a distribution generating section that generates a timing distribution of edges in the reconfigured waveform; and
    a statistical value calculating section that calculates a statistical value of the timing distribution.

2. The jitter measurement apparatus according to claim 1, wherein the sampling section samples the signal under measurement having the cycle T a certain number of times N while the signal under measurement repeats for M cycles, where M and N are coprime.

3. The jitter measurement apparatus according to claim 2, wherein the waveform reconfiguring section rearranges initial ordinal ranks k of the sample values sampled by the sampling section to have reconfigured ordinal ranks i by inputting the initial ordinal ranks k into an expression i=k·M mod N, where k is expressed by integers from 0 to N−1, and uses these rearranged sample values to shape the reconfigured waveform having the cycle T.

4. The jitter measurement apparatus according to claim 1, wherein the statistical value calculating section calculates an expected value of the timing distribution as the statistical value.

5. The jitter measurement apparatus according to claim 1, wherein the statistical value calculating section calculates a distribution width of the timing distribution as the statistical value.

6. The jitter measurement apparatus according to claim 1, wherein the distribution generating section includes:
    a unit-interval waveform generating section that generates a plurality of unit-interval waveforms by dividing the reconfigured waveform into a plurality of unit intervals;
    an aggregate value calculating section that calculates an aggregate value at each phase in each of the plurality of unit-interval waveforms by adding together the sample values at the same phase of each unit-interval waveform; and
    a difference calculating section that calculates a difference between each pair of aggregate values at adjacent phases, and
    the distribution generating section generates the timing distribution based on the differences calculated by the difference calculating section.

7. The jitter measurement apparatus according to claim 6, wherein
    the distribution generating section further includes a waveform inverting section that inverts the unit-interval waveforms generated by the unit-interval waveform generating section, and
    the aggregate value calculating section adds the sample values of the unit-interval waveforms having rising edges to the inverted sample values of the unit-interval waveforms having falling edges that are inverted by the waveform inverting section, or
    adds the sample values of the unit-interval waveforms having falling edges to the inverted sample values of the unit-interval waveforms having rising edges that are inverted by the waveform inverting section.

8. The jitter measurement apparatus according to claim 7, further comprising a prescribed bit unit-interval waveform group selecting section that selects the unit-interval waveforms generated by the unit-interval waveform generating section at prescribed bit intervals in the signal under measurement, wherein
    the aggregate value calculating section adds the sample values of the unit-interval waveforms having rising edges to the inverted sample values of the unit-interval waveforms having falling edges that are inverted by the waveform inverting section in the group of unit-interval waveforms selected by the prescribed bit unit-interval waveform group selecting section.

9. The jitter measurement apparatus according to claim 6, wherein the aggregate value calculating section adds together the sample values of the unit-interval waveforms having rising edges or the sample values of the unit-interval waveforms having falling edges.

10. The jitter measurement apparatus according to claim 6, further comprising an identical data sequence unit-interval waveform group selecting section that selects, from among the unit-interval waveforms generated by the unit-interval waveform generating section, a group of unit-interval waveforms having identical data sequences in the signal under measurement immediately prior thereto, wherein
    the aggregate value calculating section adds together the sample values of each unit-interval waveform in the group selected by the identical data sequence unit-interval waveform group selecting section.

11. The jitter measurement apparatus according to claim 6, further comprising a prescribed bit unit-interval waveform group selecting section that selects the unit-interval waveforms generated by the unit-interval waveform generating section at prescribed bit intervals in the signal under measurement, wherein the aggregate value calculating section adds together the sample values of each unit-interval waveform in the group selected by the prescribed bit unit-interval waveform group selecting section.

12. The jitter measurement apparatus according to claim 1, further comprising:

an ideal edge timing calculating section that calculates an ideal edge timing of the signal under measurement; and an error sequence statistical value calculating section that calculates a statistical value of an error sequence obtained by arranging, in a time-series, differences between expected values of the timing distribution calculated by the statistical value calculating section and the ideal edge timing calculated by the ideal edge timing calculating section.

13. The jitter measurement apparatus according to claim 1, further comprising:

an ideal edge timing calculating section that calculates an ideal edge timing of the signal under measurement; and an error sequence statistical value calculating section that calculates a frequency component of an error sequence obtained by arranging, in a time-series, differences between expected values of the timing distribution calculated by the statistical value calculating section and the ideal edge timing calculated by the ideal edge timing calculating section.

14. A communication system provided with a transmitter and a receiver, wherein the receiver includes the jitter measurement apparatus of claim 1.

15. The communication system according to claim 14, wherein the receiver further includes a jitter value notification section that notifies the transmitter concerning the statistical value calculated by the statistical value calculating section, which is a jitter value of the transmission signal, and the transmitter includes a frequency characteristic adjusting section that adjusts a frequency characteristic of the transmission signal to decrease jitter value of the transmission signal in the receiver according to the jitter value as notified by the jitter value notification section.

16. A jitter measurement method, comprising the steps of:

sampling, by a sampling section of a jitter measurement apparatus, a signal under measurement having a cycle T;

shaping, by a waveform reconfiguring section of the jitter measurement apparatus, a reconfigured waveform having the cycle T by rearranging ordinal ranks of sample values obtained at the sampling step;

generating, by a distribution generation section of the jitter measurement apparatus, a timing distribution of edges in the reconfigured waveform; and calculating, by a statistical value calculating section of the jitter measurement apparatus, a statistical value of the timing distribution.

17. The jitter measurement method according to claim 16, wherein the sampling step includes sampling the signal under measurement having the cycle T a certain number of times N while the signal under measurement repeats for M cycles, where M and N are coprime.

18. The jitter measurement method according to claim 17, wherein the reconfiguring step includes rearranging initial ordinal ranks k of the sample values obtained at the sampling step to have reconfigured ordinal ranks i by inputting the initial ordinal ranks k into an expression $i = k \cdot M \mod N$, where k is expressed by integers from 0 to N−1, and using these rearranged sample values to shape the reconfigured waveform having the cycle T.

19. A non-transitory recording medium storing thereon a program that, when used by a jitter measurement apparatus, causes the jitter measurement apparatus to function as:

a sampling section that samples a signal under measurement having a cycle T a certain number of times N while the signal under measurement repeats for M cycles, where M and N are coprime;

a waveform reconfiguring section that rearranges initial ordinal ranks k of the sample values sampled by the sampling section to have reconfigured ordinal ranks i by inputting the initial ordinal ranks k into an expression $i = k \cdot M \mod N$, where k is expressed by integers from 0 to N−1, and uses these rearranged sample values to shape a reconfigured waveform having the cycle T;

a distribution generating section that generates a timing distribution of edges in the reconfigured waveform; and a statistical value calculating section that calculates a statistical value of the timing distribution.

20. A test apparatus that provides a test signal to a device under test to test the device under test, comprising:

a signal generating section that generates the test signal; and a signal measuring section that measures an output signal of the device under test, wherein the signal measuring section includes:

a sampling section that samples the output signal having a cycle T a certain number of times N while the output signal repeats for M cycles, where M and N are coprime;

a waveform reconfiguring section that rearranges initial ordinal ranks k of the sample values sampled by the sampling section to have reconfigured ordinal ranks i by inputting the initial ordinal ranks k into an expression $i = k \cdot M \mod N$, where k is expressed by integers from 0 to N−1, and uses these rearranged sample values to shape the reconfigured waveform having the cycle T;

a distribution generating section that generates a timing distribution of edges in the reconfigured waveform; and a statistical value calculating section that calculates a statistical value of the timing distribution.

21. The test apparatus according to claim 20, wherein the signal measuring section further includes a jitter value notification section that notifies the signal generating section concerning the statistical value calculated by the statistical value calculating section, which is a jitter value of the output signal, and the signal generating section includes a frequency characteristic adjusting section that adjusts a frequency characteristic of the test signal to decrease jitter value of the output signal according to the jitter value as notified by the jitter value notification section.

* * * * *